United States Patent
Nakabayashi et al.

(10) Patent No.: US 11,495,587 B2
(45) Date of Patent: Nov. 8, 2022

(54) LIGHT EMITTING DEVICE AND METHOD OF PRODUCING LIGHT EMITTING DEVICE

(71) Applicant: NICHIA CORPORATION, Anan (JP)

(72) Inventors: Takuya Nakabayashi, Tokushima (JP); Tadaaki Ikeda, Anan (JP); Tetsuya Ishikawa, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 285 days.

(21) Appl. No.: 16/584,092

(22) Filed: Sep. 26, 2019

(65) Prior Publication Data

US 2020/0105729 A1 Apr. 2, 2020

(30) Foreign Application Priority Data

Sep. 27, 2018 (JP) .............................. JP2018-182282
Mar. 25, 2019 (JP) .............................. JP2019-056122
May 21, 2019 (JP) .............................. JP2019-095269

(51) Int. Cl.
*H01L 25/13* (2006.01)
*H01L 33/52* (2010.01)
*H01L 33/62* (2010.01)

(52) U.S. Cl.
CPC .............. *H01L 25/13* (2013.01); *H01L 33/52* (2013.01); *H01L 33/62* (2013.01); *H01L 2933/0066* (2013.01)

(58) Field of Classification Search
CPC ....... H01L 33/62; H01L 33/52; H01L 33/486; H01L 25/13; H01L 25/075; H01L 25/0753; H01L 27/153; H01L 27/156
See application file for complete search history.

(56) References Cited

U.S. PATENT DOCUMENTS

2015/0364663 A1* 12/2015 Morimura ........... H01L 25/0753
                                                          257/88
2017/0048982 A1    2/2017 Ishihara et al.
2018/0080641 A1*  3/2018 Tanaka ..................... F21V 9/30
(Continued)

FOREIGN PATENT DOCUMENTS

JP    H07066523 A    3/1995
JP    H07066543 A    3/1995
JP    2006237320 A   9/2006
(Continued)

*Primary Examiner* — Sue A Purvis
*Assistant Examiner* — Jordan M Klein
(74) *Attorney, Agent, or Firm* — Hunton Andrews Kurth LLP

(57) ABSTRACT

A light emitting device includes a substrate including first, second, third and fourth wiring portions on a top surface of a base member and arrayed in a first direction, and a connection wiring portion connecting the second and third wiring portions. The connection wiring portion includes first and second connection ends respectively connected with the second and third wiring portions, and a connection central portion connecting the first and second connection ends and having a maximum width in a second direction different from each of a maximum width of the first connection end and a maximum width of the second connection end. In the second direction, at least a part of the connection wiring portion has a width narrower than each of a maximum width of the second wiring portion and a maximum width of the third wiring portion.

19 Claims, 16 Drawing Sheets

(56) References Cited

U.S. PATENT DOCUMENTS

2018/0226549 A1    8/2018  Nakabayashi et al.

FOREIGN PATENT DOCUMENTS

| JP | 2009094351 A | 4/2009 |
|---|---|---|
| JP | 2013012545 A | 1/2013 |
| KR | 20180092861 A | 8/2018 |
| WO | 2015/174202 A1 | 11/2015 |

\* cited by examiner

LIGHT EMITTING DEVICE AND METHOD OF PRODUCING LIGHT EMITTING DEVICE

CROSS-REFERENCE TO RELATED APPLICATION

This application claims priority to Japanese Patent Application No. 2018-182282, filed on Sep. 27, 2018, and Japanese Patent Application No. 2019-056122, filed on Mar. 25, 2019, and Japanese Patent Application No. 2019-095269, filed on May 21, 2019, the disclosures of which are hereby incorporated by reference in their entireties.

BACKGROUND

The present disclosure relates to a light emitting device and a method of producing a light emitting device.

A large-scale LED light emitting device in which a plurality of LED chips are mounted on a wiring board is known. For example, Japanese Patent Publication No. 2013-012545 discloses a LED light emitting device including a large-scale wiring board having wiring electrodes provided on a top surface thereof, LED chips mounted on the wiring board, and a white member provided on the top surface of the wiring board. A region around the LED chips is filled with the white member.

SUMMARY

In certain general aspect, a light emitting device comprises a substrate including a base member, a first light emitting element, a second light emitting element, and cover member. The base member containing a resin material and having a top surface includes a first wiring portion, a second wiring portion, a third wiring portion and a fourth wiring portion that are located on the top surface of the base member and are arrayed in a first direction. The base further includes a connection wiring portion connecting the second wiring portion and the third wiring portion to each other. The first light emitting element are placed on the first wiring portion and the second wiring portion. The second light emitting element are placed on the third wiring portion and the fourth wiring portion. The cover member covers the top surface of the base member, a lateral surface of the first light emitting element and a lateral surface of the second light emitting element. The connection wiring portion includes a first connection end connected with the second wiring portion, a second connection end connected with the third wiring portion, and a connection central portion connecting the first connection end and the second connection end to each other, wherein the connection central portion has a maximum width in a second direction perpendicular to the first direction that is different from each of a maximum width of the first connection end and a maximum width of the second connection end. In the second direction, at least a part of the connection wiring portion has a width that is narrower than each of a maximum width of the second wiring portion and a maximum width of the third wiring portion, and as seen in a top view, at least a part of the connection central portion is separate from the first light emitting element and the second light emitting element.

In another certain general aspect, a method of producing a light emitting device comprises: providing a substrate; placing a first light emitting element on the first wiring portion and the second wiring portion using the connection wiring portion as a reference; placing a second light emitting element on the third wiring portion and the fourth wiring portion using the connection wiring portion as a reference; and forming a cover member covering the top surface of the base member, a lateral surface of the first light emitting element and a lateral surface of the second light emitting element. The substrate includes a base member containing a resin material and having a top surface, a first wiring portion, a second wiring portion, a third wiring portion and a fourth wiring portion that are located on the top surface of the base member, and arrayed in a first direction, and a connection wiring portion connecting the second wiring portion and the third wiring portion to each other. The connection wiring portion includes a first connection end connected with the second wiring portion, a second connection end connected with the third wiring portion and a connection central portion connecting the first connection end and the second connection end to each other. The connection central portion has a maximum width, in a second direction perpendicular to the first direction, that is different from each of a maximum width of the first connection end and a maximum width of the second connection end. The connection wiring portion includes a portion that is narrower than each of a maximum width of the second wiring portion and a maximum width of the third wiring portion in the second direction.

According to the above aspects, it is possible to provide a light emitting device and a method of producing a light emitting device having an increased joining strength between a substrate and a cover member.

DETAILED DESCRIPTION

Figure 1A:
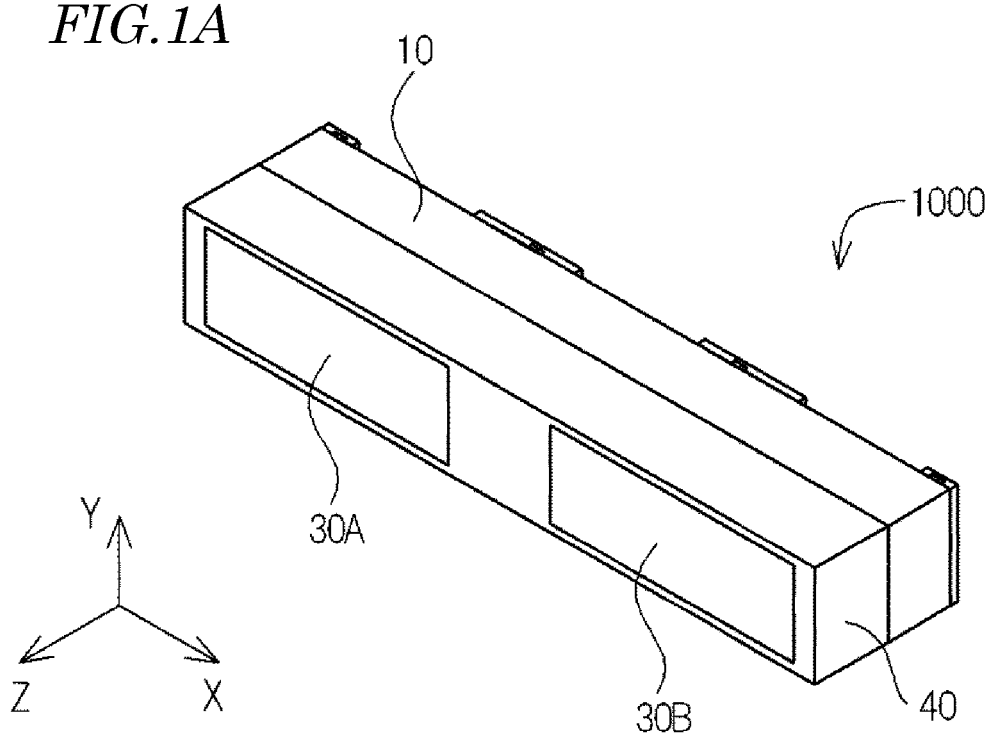
FIG. 1A is a schematic perspective view of a light emitting device according to an embodiment of the present disclosure.

Hereinafter, embodiments of the present disclosure will be described with reference to the attached drawings. Light emitting devices described below embody the technological idea of the present invention, and the present invention is not limited to any of the following embodiments unless otherwise specified. A content described in one embodiment is applicable to other embodiments and modifications. In the drawings, the size, positional arrangement or the like may be emphasized for clear illustration. The same names and the same reference signs represent the same or substantially the same components, and such same components or such substantially the same components will not be described in detail.

A light emitting device 1000 according to an embodiment of the present disclosure will be described with respect to FIG. 1A through FIG. 9. The light emitting device 1000 includes a substrate 10, a first light emitting element 20A, a second light emitting element 20B, and a cover member 40 formed of a resin material.

The substrate 10 includes a base member 11 containing a resin material and having a top surface 111. The substrate 10 includes a first wiring portion 12A, a second wiring portion 12B, a third wiring portion 12C and a fourth wiring portion 12D which are located on the top surface 111 of the base member 11. The first wiring portion 12A, the second wiring portion 12B, the third wiring portion 12C and the fourth wiring portion 12D are arrayed in a first direction. In this specification, the expression "arrayed in the first direction" indicates that at least a part of the first wiring portion 12A, at least a part the second wiring portion 12B, at least a part the third wiring portion 12C and at least a part the fourth wiring portion 12D are located on an imaginary straight line extending in the first direction.

The substrate 10 further includes a connection wiring portion 13 connecting the second wiring portion 12B and the third wiring portion 12C to each other. The connection wiring portion 13 includes a first connection end 13A connected with the second wiring portion 12B, a second connection end 13C connected with the third wiring portion 12C, and a connection central portion 13B connecting the first connection end 13A and the second connection end 13C to each other. The connection central portion 13B has a maximum width in a second direction perpendicular to the first direction. The maximum width of the connection central portion 13B is different from each of a maximum width the first connection end 13A and a maximum width of the second connection end 13C. In the second direction, a width of at least a part of the connection wiring portion 13 is narrower than each of a maximum width of the second wiring portion 12B and a maximum width of the third wiring portion 12C. As seen in a top view, at least a part of the connection central portion 13B is separate from the first light emitting element 20A and the second light emitting element 20B. Hereinafter, the first light emitting element 20A and/or the second light emitting element 20B may be referred to simply as the "light emitting element(s)".

As described above, the width of at least a part of the connection wiring portion 13 is narrower than each of the maximum width of the second wiring portion 12B and the maximum width of the third wiring portion 12C in the second direction. Such a structure can increase the area size of a portion, of the top surface 111 of the base member 11, that is exposed from the connection wiring portion 13. This increases the area size of a region where the top surface 111 of the base member 11 and the cover member 40 are in contact with each other, and therefore can increase the joining strength between the substrate 10 and the cover member 40. The base member 11 and the cover member 40 both contain a resin material. Therefore, in general, the joining strength between the base member 11 and the cover member 40 is higher than the joining strength between the connection wiring portion 13 and the cover member 40.

Figure 5A:
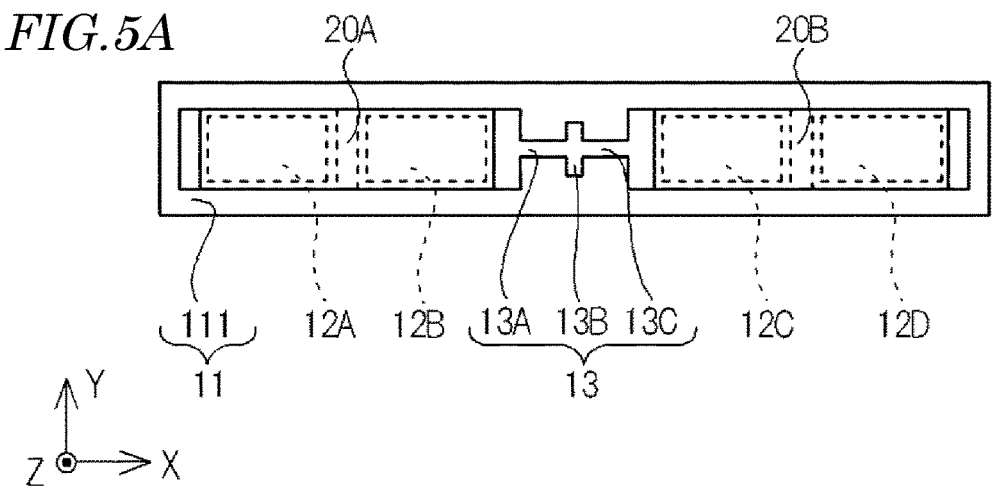
FIG. 5A is a schematic top view of the substrate, a first light emitting element and a second light emitting element according to the embodiment.

As seen in a top view, at least a part of the connection central portion 13B is separate from the first light emitting element 20A and the second light emitting element 20B (see, for example, FIG. 5A). Such a structure allows the first light emitting element 20A and/or the second light emitting element 20B to be placed on the substrate 10 using the connection central portion 13B as a reference (fiducial mark). This can improve the positional precision of the first light emitting element 20A and/or the second light emitting element 20B with respect to the substrate 10. The expression "using the connection central portion 13B as a reference" indicates that the position of the first light emitting element 20A and/or the second light emitting element 20B is determined on the basis of the position of the connection central portion 13B.

In the second direction, the maximum width of the connection central portion 13B of the connection wiring portion 13 is different from each of the maximum width of the first connection end 13A and the maximum width of the second connection end 13C. Such a structure makes it easier to recognize the position of the connection central portion 13B.

The substrate 10 includes the first wiring portion 12A, the second wiring portion 12B, the third wiring portion 12C and the fourth wiring portion 12D arrayed in the first direction. The first wiring portion 12A and the second wiring portion 12B are separate from each other, and the first light emitting element 20A is placed on the first wiring portion 12A and the second wiring portion 12B. The first wiring portion 12A and the second wiring portion 12B supply electric power to the first light emitting element 20A. Similarly, the third wiring portion 12C and the fourth wiring portion 12D are separate from each other, and the second light emitting element 20B is placed on the third wiring portion 12C and the fourth wiring portion 12D. The third wiring portion 12C and the fourth wiring portion 12D supply electric power to the second light emitting element 20B.

Figure 3A:
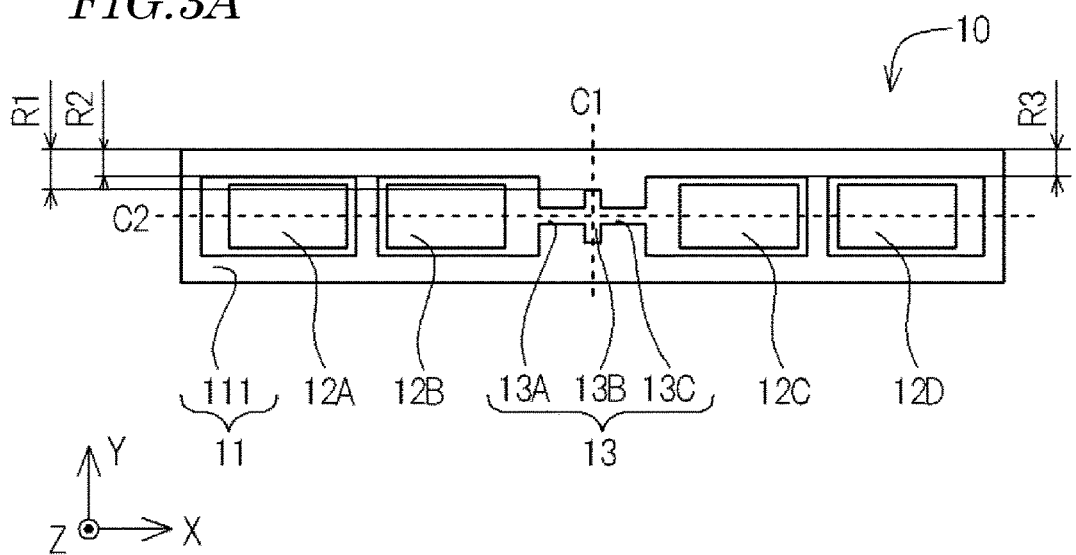
FIG. 3A is a schematic top view of a substrate according to the embodiment.

As shown in FIG. 3A, in the case where the base member 11 is elongated in a longitudinal direction, it is preferable that the first wiring portion 12A, the second wiring portion 12B, the third wiring portion 12C and the fourth wiring portion 12D are arrayed along the longitudinal direction of the base member 11. With such an arrangement, the width of the base member 11 in the second direction perpendicular to the longitudinal direction (i.e., first direction) can be short. This can reduce the size of the light emitting device 1000. In this specification, the term "perpendicular" indicates that a tolerance within about 90±3° is allowed. In FIG. 3A and the like, the first direction is the same as an X direction. In FIG. 3A and the like, the second direction is the same as a Y direction.

It is preferable that as shown in FIG. 3A, the first wiring portion 12A, the second wiring portion 12B, the third wiring portion 12C, the fourth wiring portion 12D and the connection wiring portion 13 do not have any overlapping region in the second direction. The structure in which the first wiring portion 12A, the second wiring portion 12B, the third wiring portion 12C, the fourth wiring portion 12D and the connection wiring portion 13 have an overlapping region in the second direction is a structure in which a straight line parallel to the second direction (i.e., Y direction) overlaps at least two of the first wiring portion 12A, the second wiring portion 12B, the third wiring portion 12C, the fourth wiring portion 12D and the connection wiring portion 13. Namely, it is preferable that a straight line parallel to the second direction does not overlap at least two of the first wiring portion 12A, the second wiring portion 12B, the third wiring portion 12C, the fourth wiring portion 12D and the connection wiring portion 13. Such a structure can reduce the size of the light emitting device 1000 in the second direction.

As shown in FIG. 3A, it is preferable that, in the second direction, a shortest distance R1 from an outer edge of the base member 11 to an outer edge of the connection wiring portion 13 is longer than a shortest distance R2 from the outer edge of the base member 11 to an outer edge of the second wiring portion 12B. Such an arrangement allows to increase the area size of a region where the top surface 111 of the base member 11 and the cover member 40 are in contact with each other in the vicinity of the connection wiring portion 13. Therefore, delamination of the cover member 40 from the substrate 10 can be alleviated. It is preferable that in the second direction, the shortest distance R1 from the outer edge of the base member 11 to the outer edge of the connection wiring portion 13 is longer than a shortest distance R3 from the outer edge of the base member 11 to an outer edge of the third wiring portion 12C. Such an arrangement allows to increase the area size of the region where the top surface 111 of the base member 11 and the cover member 40 are in contact with each other in the vicinity of the connection wiring portion 13. Therefore, delamination of the cover member 40 from the substrate 10 can be alleviated.

It is preferable that as shown in FIG. 3A, as seen in a top view, the outer edge of the base member 11 is separate from the first wiring portion 12A, the second wiring portion 12B, the third wiring portion 12C, the fourth wiring portion 12D and the connection wiring portion 13. Such an arrangement allows to increase the area size of the region where the top surface 111 of the base member 11 and the cover member 40 are in contact with each other in the vicinity of the outer edge of the base member 11. Therefore, the cover member 40 can be alleviated to be delaminated from the substrate 10.

Figure 3B:
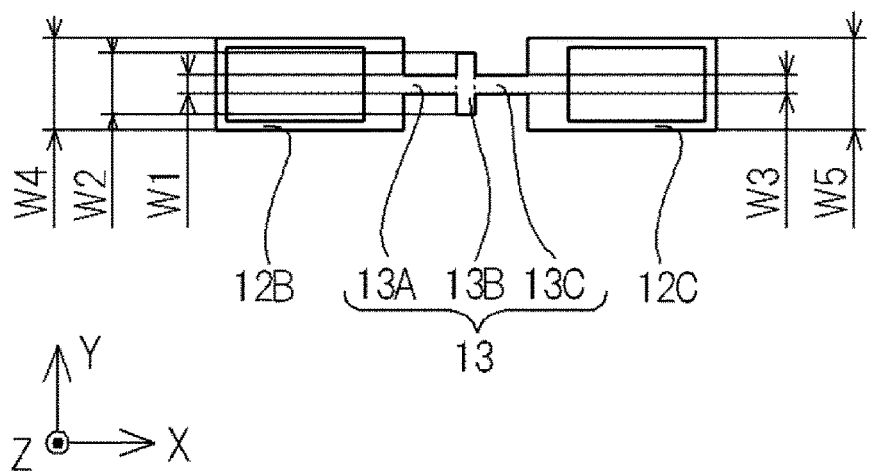
FIG. 3B is a schematic top view of a second wiring portion, a connection wiring portion and a third wiring portion according to the embodiment.
Figure 3C:
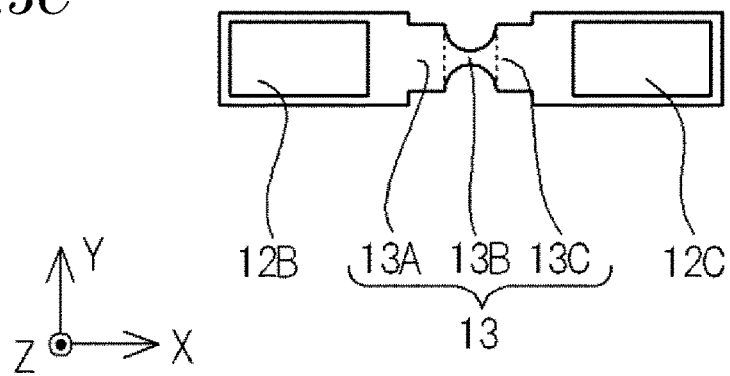
FIG. 3C is a schematic top view of a modification of the second wiring portion, the connection wiring portion and the third wiring portion according to the embodiment.
Figure 3D:
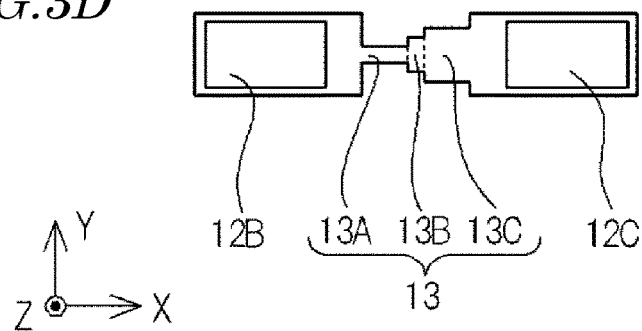
FIG. 3D is a schematic top view of another modification of the second wiring portion, the connection wiring portion and the third wiring portion according to the embodiment.
Figure 3E:
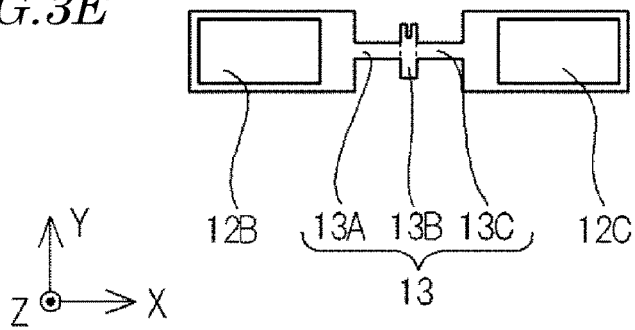
FIG. 3E is a schematic top view of still another modification of the second wiring portion, the connection wiring portion and the third wiring portion according to the embodiment.

As shown in FIG. 3C, in the second direction, the maximum width of the connection central portion 13B may be narrower than each of the maximum width of the first connection end 13A and the maximum width of the second connection end 13C. As shown in FIG. 3D, in the second direction, the maximum width of the first connection end 13A may be narrower than the maximum width of the connection central portion 13B and the maximum width of the second connection end 13C, and in the second direction, the maximum width of the connection central portion 13B may be narrower than the maximum width of the second connection end 13C. In each of FIG. 3B through FIG. 3K, the border between the first connection end 13A and the connection central portion 13B and the border between the connection central portion 13B and the second connection end 13C are represented by the dashed lines.

As shown in FIG. 3B, in the second direction, the maximum width (represented by W2) of the connection central portion 13B may be wider than the maximum width (represented by W1) of the first connection end 13A and the maximum width (represented by W3) of the second connection end 13C. In the case where the first light emitting element 20A and/or the second light emitting element 20B, and the substrate 10, are to be bonded to each other by use of a conductive bonding member, it is preferable that in the second direction, the maximum width W2 of the connection central portion 13B is wider than the maximum width W1 of the first connection end 13A and the maximum width W3 of the second connection end 13C. Such an arrangement can narrow the width of the first connection end 13A and the width of the second connection end 13C in the second direction, and therefore, the molten conductive bonding member is less likely to be spread on the first connection end 13A and the second connection end 13C. This can also alleviate the variance in the thickness of the conductive bonding member in each of light emitting devices. The "thickness of the conductive bonding member" refers to the thickness of the conductive bonding member in a Z direction perpendicular to both of the X direction and the Y direction.

It is preferable that as shown in FIG. 3B, in the second direction, the maximum width W1 of the first connection end 13A and the maximum width W3 of the second connection end 13C are equal to each other. Such an arrangement can alleviate the variance in the thickness between the conductive bonding member spread on the first connection end 13A and the conductive bonding member spread on the second connection end 13C. This can alleviate the variance in the positions at which the first light emitting element 20A and/or the second light emitting element 20B are mounted. In this specification, the expression "equal width" indicates that a tolerance of about ±5 µm is allowed.

As shown in FIG. 3B, it is preferable that, in the second direction, the maximum width W1 of the first connection end 13A is narrower than the maximum width (represented by W4) of the second wiring portion 12B. With such an arrangement, the conductive bonding member is less likely to be spread from the second wiring portion 12B to the first connection end 13A. This can alleviate the variance in the thickness of the conductive bonding member in each of the light emitting devices. It is preferable that, in the second direction, the maximum width W1 of the first connection end 13A is at least 0.2 times and at most 0.6 times the maximum width W4 of the second wiring portion 12B. With the structure in which the maximum width W1 of the first connection end 13A is at most 0.6 times the maximum width W4 of the second wiring portion 12B in the second direction, the conductive bonding member is less likely to spread from the second wiring portion 12B to the first connection end 13A unnecessarily broadly. With the structure in which the maximum width W1 of the first connection end 13A is at least 0.2 times the maximum width W4 of the second wiring portion 12B in the second direction, the shape of the first connection end 13A is easily recognizable.

It is preferable that as shown in FIG. 3B, in the second direction, the maximum width W3 of the second connection end 13C is narrower than a maximum width (represented by W5) of the third wiring portion 12C. With such an arrangement, the conductive bonding member is less likely to be spread from the third wiring portion 12C to the second connection end 13C. This can alleviate the variance in the thickness of the conductive bonding member in each of the light emitting devices. It is preferable that, in the second direction, the maximum width W3 of the second connection end 13C is at least 0.2 times and at most 0.6 times the maximum width W5 of the third wiring portion 12C. With the structure in which the maximum width W3 of the second connection end 13C is at most 0.6 times the maximum width W5 of the third wiring portion 12C in the second direction, the conductive bonding member is less likely to be spread from the third wiring portion 12C to the second connection end 13C unnecessarily broadly. With the structure in which the maximum width W3 of the second connection end 13C is at least 0.2 times the maximum width W5 of the third wiring portion 12C in the second direction, the shape of the second connection end 13C is easily recognizable.

It is preferable that as shown in FIG. 3B, the connection central portion 13B is elongated in the second direction (i.e., Y direction). With the structure in which the connection central portion 13B is elongated in the second direction, the connection central portion 13B can have a narrow width in the first direction, which can reduce the size of the light emitting device 1000. In this specification, the expression "extend in the second direction" indicates that extension at an angle within ±3° from the second direction is allowed. The expression that "the connection central portion 13B is elongated in the second direction" encompasses a case shown in FIG. 3E in which an extremity of the connection central portion 13B is divided.

Figure 3F:
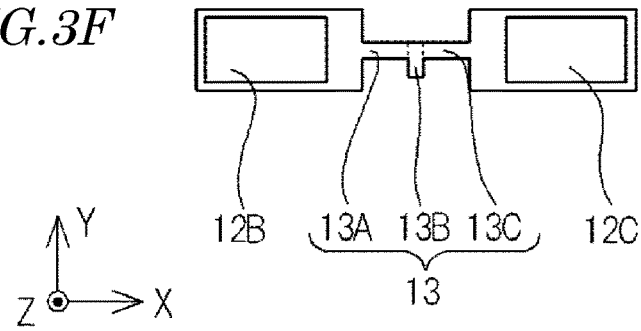
FIG. 3F is a schematic top view of yet another modification of the second wiring portion, the connection wiring portion and the third wiring portion according to the embodiment.

As shown in FIG. 3F, in the second direction (Y direction), the connection central portion 13B may include a portion extending in only a −Y direction from a center of the substrate 10. Alternatively, as shown in FIG. 3B, regarding the second direction, the connection central portion 13B may include a portion extending in a +Y direction from the center of the substrate 10 and a portion extending in the −Y direction from the center of the substrate 10. With the structure in which the connection central portion 13B includes a portion extending in the +Y direction and a portion extending in the −Y direction, the position of the connection central portion 13B is easily recognizable.

Figure 3G:
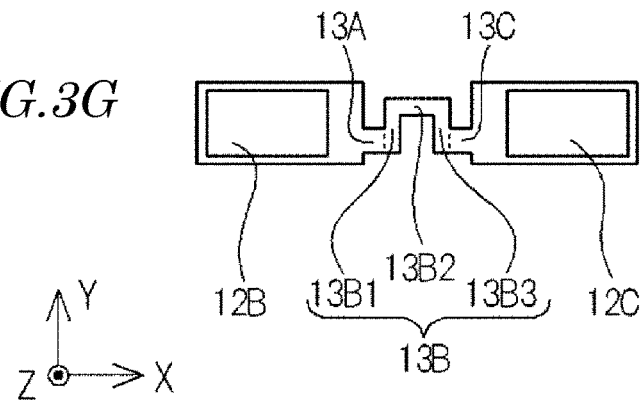
FIG. 3G is a schematic top view of yet another modification of the second wiring portion, the connection wiring portion and the third wiring portion according to the embodiment.

The connection central portion 13B may have a varying width in the second direction. As shown in FIG. 3G, the connection central portion 13B may include a first wide portion 13B1, a second narrow portion 13B2 and a third wide portion 13B3. Alternatively, as shown in FIG. 3B, the width of the connection central portion 13B may be uniform.

Figure 3H:
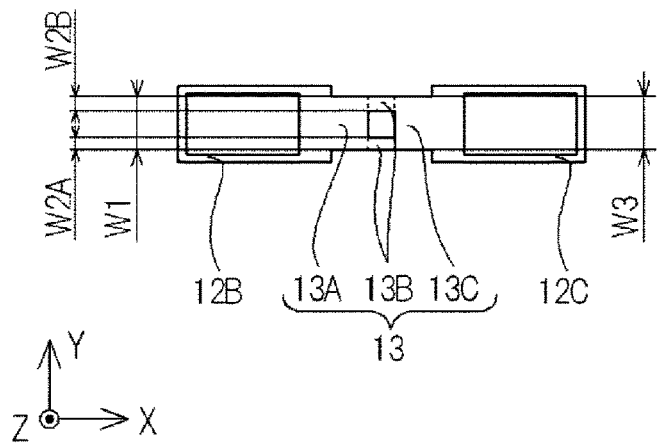
FIG. 3H is a schematic top view of yet another modification of the second wiring portion, the connection wiring portion and the third wiring portion according to the embodiment.
Figure 3I:
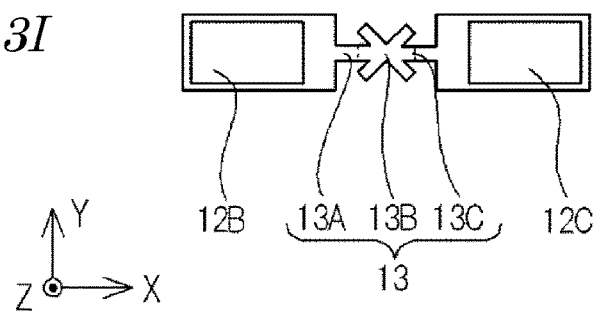
FIG. 3I is a schematic top view of yet another modification of the second wiring portion, the connection wiring portion and the third wiring portion according to the embodiment.

As shown in FIG. 3H and FIG. 3I, the connection central portion 13B may be divided into a plurality of portions in the Y direction. In the case where the connection central portion 13B is divided into a plurality of portions, e.g., as in FIG. 3H, the maximum width of the connection central portion 13B in the second direction is a sum of widths W2A and W2B of the plurality of portions.

Alternatively, as shown in FIG. 3B, the connection central portion 13B may not be divided in the Y direction. With the structure in which the connection central portion 13B is not divided in the Y direction, the distance from the outer edge of the base member 11 to the connection central portion 13B is made longer more easily than with the structure in which the connection central portion 13B is divided into a plurality of portions as in the example shown FIG. 3H. This makes it easy to increase the area size of a region where the top surface 111 of the base member 11 and the cover member 40 are in contact with each other in the vicinity of the outer edge of the base member 11. Therefore, the cover member 40 is less likely to be delaminated from the substrate 10.

Figure 3J:
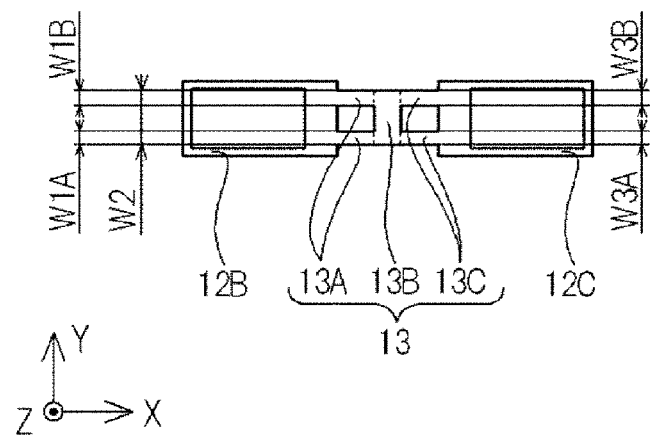
FIG. 3J is a schematic top view of yet another modification of the second wiring portion, the connection wiring portion and the third wiring portion according to the embodiment.

As shown in FIG. 3J, the first connection end 13A and/or the second connection end 13C may be divided into a plurality of portions in the Y direction. In the case where the first connection end 13A is divided into a plurality of portions, the maximum width W1 of the first connection end 13A in the second direction is a sum of widths W1A and W1B of the plurality of portions. Similarly, in the case where the second connection end 13C is divided into a plurality of portions, the maximum width W3 of the second connection end 13C in the second direction is a sum of widths W3A and W3B of the plurality of portions.

Alternatively, as shown in FIG. 3B, neither the first connection end 13A nor the second connection end 13C may be divided in the Y direction. As shown in FIG. 3A, it is preferable that, neither the first connection end 13A nor the second connection end 13C is divided in the Y direction. With the structure in which neither the first connection end 13A nor the second connection end 13C is divided, the distance from the outer edge of the base member 11 to each of the first connection end 13A and the second connection end 13C is made longer more easily than with the structure in which the first connection end 13A and/or the second connection end 13C is divided into a plurality of portions. This makes it easy to increase the area size of a region where the top surface 111 of the base member 11 and the cover member 40 are in contact with each other in the vicinity of the outer edge of the base member 11. Therefore, the cover member 40 is less likely to be delaminated from the substrate 10.

Figure 3K:
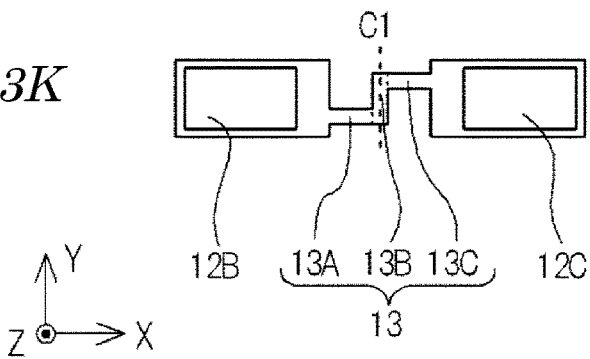
FIG. 3K is a schematic top view of yet another modification of the second wiring portion, the connection wiring portion and the third wiring portion according to the embodiment.

As shown in FIG. 3K, the connection wiring portion may not be left-right-symmetrical with respect to an imaginary center line C1, of the substrate 10. Alternatively, as shown in FIG. 3A, the connection wiring portion 13 may be left-right-symmetrical with respect to the center line C1 of the substrate 10. The center line C1 is parallel to the second direction. With the arrangement in which as shown in FIG. 3A, the connection wiring portion 13 is left-right-symmetrical with respect to the center line C1 of the substrate 10 parallel to the second direction, the distance from the outer edge of the base member 11 to each of the first connection end 13A and the second connection end 13C is made longer more easily than with the arrangement in which the connection wiring portion 13 is not left-right-symmetrical with respect to the center line C1. This makes it easy to increase the area size of a region where the top surface 111 of the base member 11 and the cover member 40 are in contact with each other in the vicinity of the outer edge of the base member 11. Therefore, the cover member 40 is less likely to be delaminated from the substrate 10. As shown in FIG. 3A, it is preferable that the connection wiring portion 13 is up-down-symmetrical with respect to an imaginary center line C2 of the substrate 10. The center line C2 is parallel to the first direction. With such an arrangement, the distance from the outer edge of the base member 11 to each of the first connection end 13A and the second connection end 13C is made longer more easily than with the arrangement in which the connection wiring portion 13 is not up-down-symmetrical with respect to the center line C2. This makes it easy to increase the area size of a region where the top surface 111 of the base member 11 and the cover member 40 are in contact with each other in the vicinity of the outer edge of the base member 11. Therefore, the cover member 40 is less likely to be delaminated from the substrate 10.

Figure 2A:
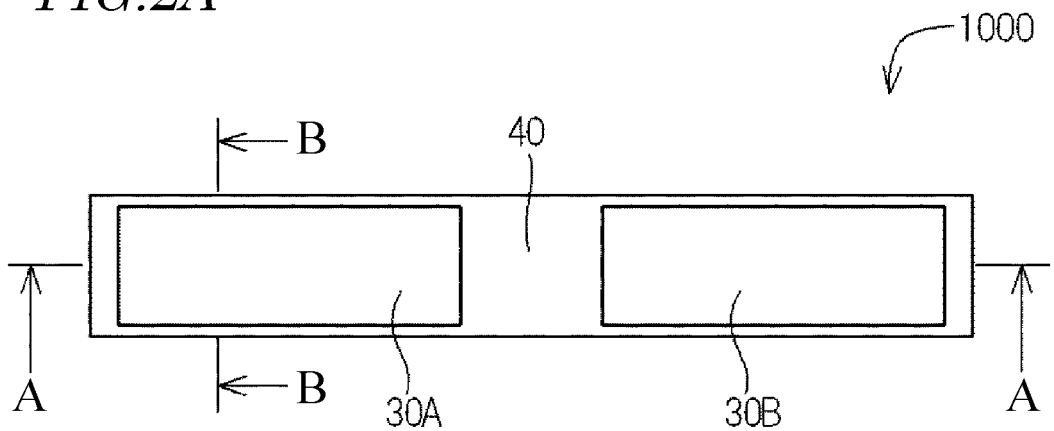
FIG. 2A is a schematic top view of the light emitting device according to the embodiment.
Figure 2A:
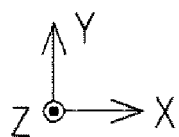
Figure 2B:
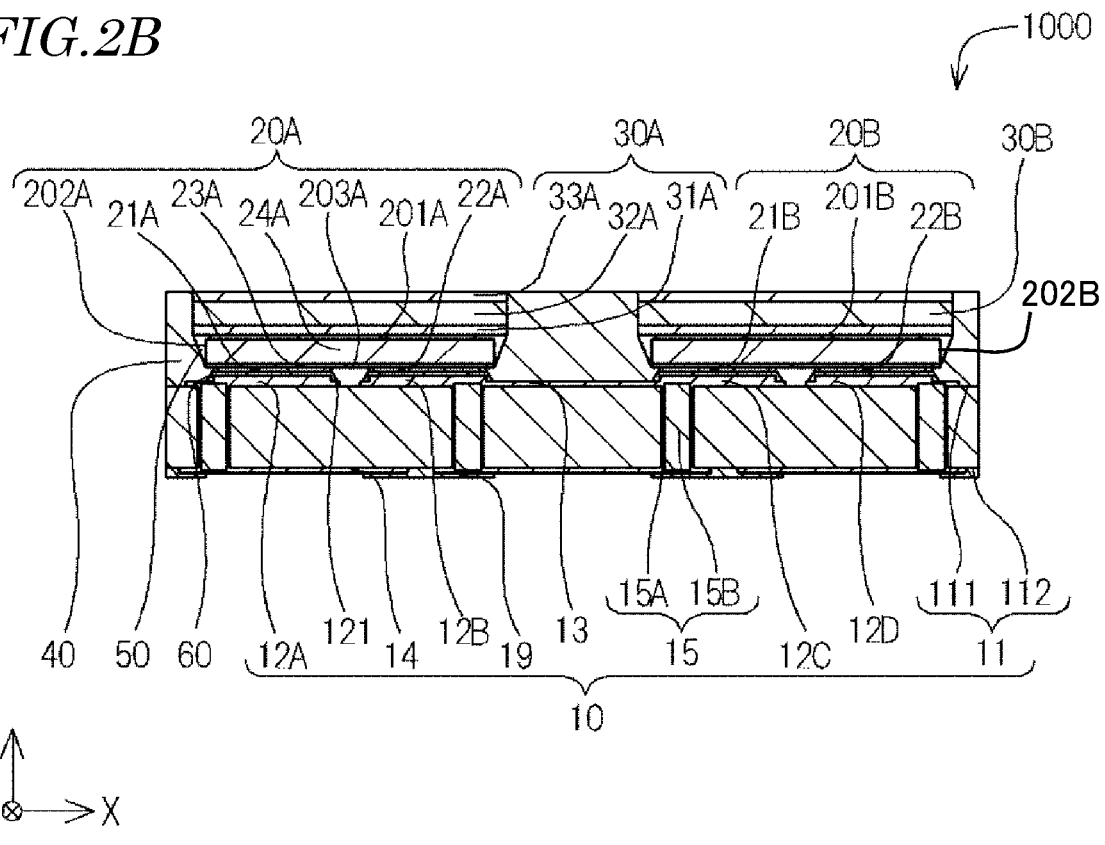
FIG. 2B is a schematic cross-sectional view taken along line A-A in FIG. 2A.

It is preferable that the first wiring portion 12A, the second wiring portion 12B, the third wiring portion 12C and the fourth wiring portion 12D each include a protrusion 121 at a position overlapping an electrode of the light emitting element 20A or 20B as seen in a top view (see, e.g, FIG. 2B). In the case where a meltable adhesive is used for the conductive bonding member (represented by reference sign 60 in FIG. 2B), in the step of connecting the protrusions 121 of the first wiring portion 12A, the second wiring portion 12B, the third wiring portion 12C and the fourth wiring portion 12D and the electrodes of the light emitting elements 20A and 20B to each other, a self-alignment effect is exerted to positionally align the light emitting elements 20A and 20B and the substrate 10 easily.

Figure 2C:
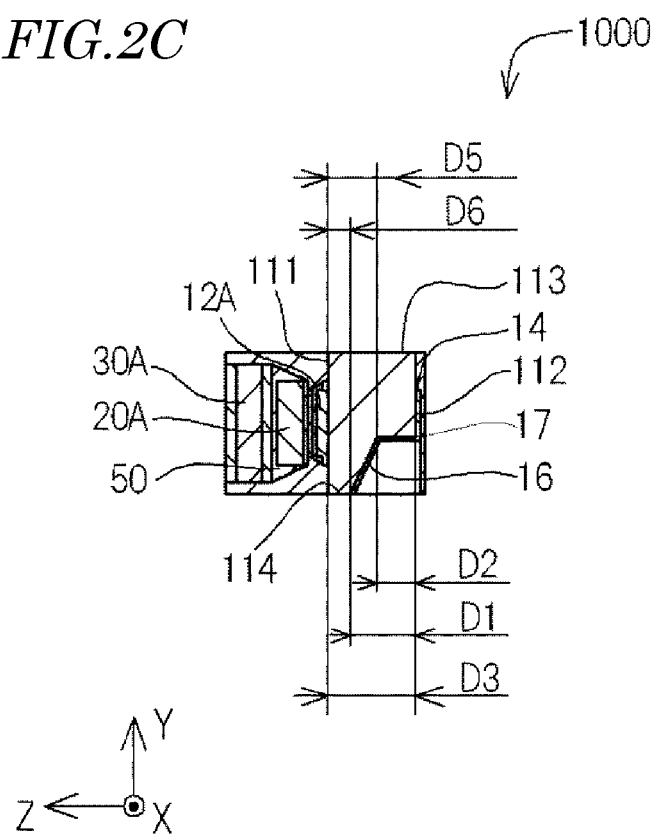
FIG. 2C is a schematic cross-sectional view taken along line B-B in FIG. 2A.

The base member 11 of the substrate 10 further includes a bottom surface 112 positioned opposite to the top surface 111, a front surface 113 adjacent to the top surface 111 and perpendicular to the top surface 111, and a rear surface 114 positioned opposite to the front surface 113 (see, FIG. 2C). As shown in FIG. 2C, the base member 11 may include one or more recesses 16 opened on the bottom surface 112 and the rear surface 114.

The substrate 10 may include fifth wiring portions 14, sixth wiring portions 17 and vias 15 (FIG. 2B). Each of the fifth wiring portions 14 is positioned on the bottom surface 112 of the base member 11, and is electrically connected with the first wiring portion 12A, the second wiring portion 12B, the third wiring portion 12C, the fourth wiring portion 14D and/or the connection wiring portion 13. The fifth wiring portion 14 which is connected with the first wiring portion 12A and the fifth wiring portion 14 which is connected with the second wiring portion 12B are separate from each other. Such a structure may prevent the first light emitting element 20A from being shortcircuited. Similarly, the fifth wiring portion 14 which is connected with the third wiring portion 12C and the fifth wiring portion 14 which is connected with the fourth wiring portion 12D are separate from each other. Such a structure may prevent the second light emitting element 20B from being shortcircuited.

Each of the sixth wiring portion 17 may cover an inner wall of the corresponding one of the recesses 16. The vias 15 each electrically connect the first wiring portion 12A, the second wiring portion 12B, the third wiring portion 12C, the fourth wiring portion 12D and/or the connection wiring portion 13, and the fifth wiring portion 14, to each other. The sixth wiring portions 17 and the vias 15 are located such that the first wiring portion 12A and the second wiring portion 12B are not electrically connected with each other. Similarly, the sixth wiring portions 17 and the vias 15 are located such that the third wiring portion 12C and the fourth wiring portion 12D are not electrically connected with each other.

Referring to FIG. 2B, even if either one of the via 15 connected with the second wiring portion 12B and the via 15 connected with the third wiring portion 12C is open-circuit, electric power can be supplied to the first light emitting element 20A and the second light emitting element 20B because the second wiring portion 12B and the third wiring portion 12C are electrically connected with each other by the connection wiring portion 13.

Figure 4:
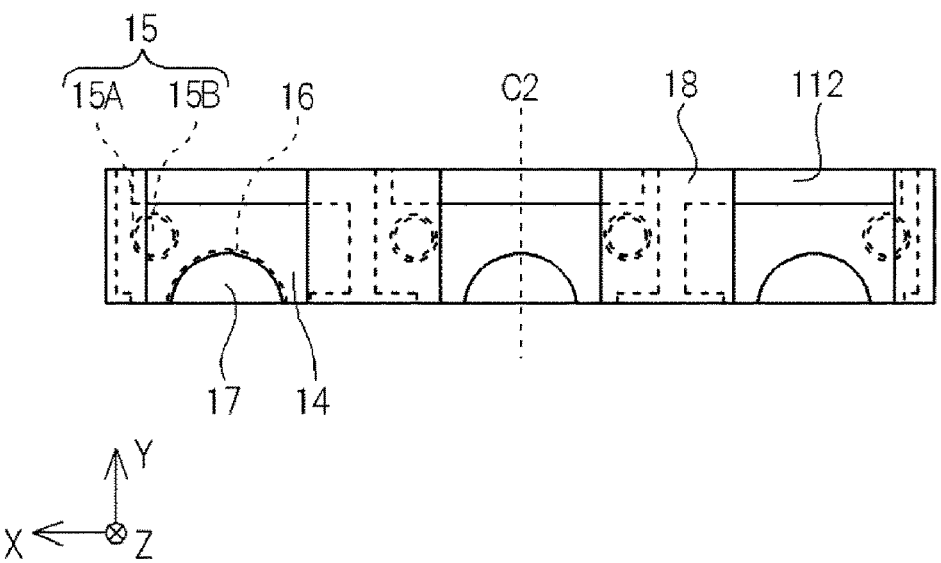
FIG. 4 is a schematic bottom view of the light emitting device according to the embodiment.

In the case where the substrate 10 includes the vias 15, as shown in FIG. 4, it is preferable that the vias 15 are circular as seen in a bottom view. The vias 15 of such a shape can be easily formed by drilling or the like. In the case where the vias 15 are circular as seen in a bottom view, it is preferable that the vias 15 each have a diameter of 100 μm or longer and 150 μm or shorter. With the structure in which the vias 15 each have a diameter of 100 μm or longer, the light emitting device 1000 has an improved heat dissipation. With the structure in which the vias 15 each have a diameter of 150 μm or shorter, a decrease in the strength of the substrate 10 is alleviated. In this specification, the term "circular" encompasses having a shape of a true circle and also encompasses having a shape close to a true circle (e.g., an elliptical shape, or a shape of a square with the four corners largely chamfered in an arcked shape).

The vias 15 may each be formed of a through-hole formed in the base member 11 and a conductive material filling the through-hole. As shown in FIG. 2B, the vias 15 may each include a seventh wiring portion 15A covering an inner wall of the through-hole in the base member 11 and a filling member 15B filling a space enclosed by the seventh wiring portion 15A. The filling member 15B may be conductive or insulating. It is preferable that the filling member 15B is formed of a resin material. In general, a pre-curing resin material has a higher fluidity than that of a molten metal material, and thus easily fills the space enclosed by the seventh wiring portion 15A. Therefore, use of a resin material for the filling member 15B makes it easy to produce the substrate 10. Examples of the resin material that easily fills such a space enclosed by the seventh wiring portion 15A include an epoxy resin.

In the case where a resin material is used for the filling member 15B, it is preferable that the resin material contains an additive in order to decrease the coefficient of linear thermal expansion of the filling member 15B. This decreases the difference in the coefficient of linear thermal expansion between the seventh wiring portion 15A and the filling member 15B, and therefore, can alleviate generation of a gap between the seventh wiring portion 15A and the filling member 15B due to heat from the light emitting elements 20A or 20B. Examples of the additive include silicon oxide.

In the case where a metal material is used for the filling member 15B, the heat dissipation property can be improved. In the case where the vias 15 are each formed of a through-hole formed in the base member 11 and a conductive material filling the through-hole, it is advantageous to use a metal material having a high thermal conductivity such as Ag, Cu or the like.

As seen in a bottom view, the fifth wiring portion 14 may each be separate from the outer edge of the base member 11 or may each be formed to reach the outer edge of the base member 11. As shown in FIG. 4, it is preferable that the fifth wiring portion 14 is formed to reach each of two outer edges of the base member 11 opposing each other in the shorter direction (i.e., Y direction). With the structure in which the fifth wiring portion 14 is formed to reach the outer edges of the base member 11 in the shorter direction (i.e., Y direction), the fifth wiring portion 14 of one of the base members 11 and the fifth wiring portion 14 of the other base member 11 adjacent to each other in the shorter direction can be connected with each other in the substrate in an integral state before being divided into a plurality of individual substrates 10 (see, e.g., FIG. 10A). Therefore, before being divided into a plurality of individual substrates 10, the fifth wiring portion 14 of one of the substrates 10 and the fifth wiring portion 14 of the other substrate 10 adjacent to each other in the shorter direction are electrically connected with each other. In this manner, the first wiring portion 12A, the second wiring portion 12B, the third wiring portion 12C, the fourth wiring portion 12D and the connection wiring portion 13 of one of the substrates 10 and the first wiring portion 12A, the second wiring portion 12B, the third wiring portion 12C, the fourth wiring portion 12D and the connection wiring portion 13 of the other substrate 10 adjacent to each other can be respectively electrically connected with each other. This makes it easy to form a plating layer, by electrolytic plating, at an outermost surface of each of the first wiring portion 12A, the second wiring portion 12B, the third wiring portion 12C, the fourth wiring portion 12D and the connection wiring portion 13 of each of the substrates 10.

It is preferable that a gold plating layer is provided at the outermost surface of each of the first wiring portion 12A, the second wiring portion 12B, the third wiring portion 12C, the fourth wiring portion 12D, the connection wiring portion 13 and the fifth wiring portion 14 of each of the base members 11. Such a gold plating layer positioned at the outer surfaces of the wiring portions can alleviate oxidation and corrosion of the surfaces of the wiring portions, and provides a high solderability. In the case of using an electrolytic plating technique, the plated layer contains less catalyst poison such as lead, amine, sulfur or the like as compared to the case of using an electroless plating technique. The content of sulfur in the gold plating layer formed by electrolytic plating is low. Therefore, in the case where an addition reaction type silicone resin formed by using a platinum-based catalyst is cured while being in contact with the gold plating layer, the reaction of sulfur and platinum can be alleviated. This can alleviate an insufficient curing of the addition reaction type silicone resin formed by using a platinum-based catalyst.

The fifth wiring portion 14 merely needs to reach each of the outer edges of the base member 11 facing each other. The fifth wiring portion 14 may be formed to reach each of the outer edge of the base member 11 opposing each other in the longitudinal direction (i.e., X direction). In this case, in the substrate in an integral state before being divided into a plurality of individual substrates 10, the fifth wiring portion 14 of one of the substrates 10 and the fifth wiring portion 14 of the other substrate 10 adjacent to each other in the longitudinal direction can be connected with each other.

The recesses 16 of the base member 11 may run through the base member 11 or, as shown in FIG. 2C, may not run through the base member 11. In the case where the recesses 16 do not run through the base member 11, the base member 11 can have a higher strength than in the case where the recesses 16 run through the base member 11. In the case where the recesses 16 do not run through the base member 11, it is preferable that a maximum depth of each of the plurality of recesses 16 in the Z direction is 0.4 to 0.8 times a thickness D3 (FIG. 2C) of the base member 11 in the Z direction. With the structure in which the depth of each recess 16 is larger than 0.4 times the thickness D3 of the base member 11, the joining member to be formed in each recess 16 can have a large volume. This can increase the joining strength between the light emitting device 1000 and a support substrate. With the structure in which the depth of each recess 16 is smaller than 0.8 times the thickness D3 of the base member 11, the base member 11 can have an increased strength.

The light emitting device 1000 may be of a top view type, in which the light emitting device 1000 is mounted in a state where the bottom surface 112 of the base member 11 and a support substrate face each other. Alternatively the light emitting device 1000 may be of a side view type, in which the light emitting device 1000 is mounted in a state where the rear surface 114 of the base member 11 and the support substrate face each other. Regardless of whether the light emitting device 1000 is employed as the top view type or the side view type, the volume of the joining member is increased, to thereby increasing the joining strength between the light emitting device 1000 and the support substrate. The joining strength between the light emitting device 1000 and the support substrate can be increased especially in the case where the light emitting device 1000 is employed as a side view type.

Regarding the depth of each recess 16 in the Z direction, it is preferable that as shown in FIG. 2C, a depth D1 of a portion of the recess 16 that is on the rear surface 114 side is greater than a depth D2 of a portion of the recess 16 that is on the front surface 113 side. With such a structure, in the Z direction, a thickness D5 of a portion of the base member 11 that is on the front surface 113 side with respect to the recess 16 can be made greater than a thickness D6 of a portion of the base member 11 that is on the rear surface 114 side with respect to the recess 16. This can alleviate a decrease in the strength of the base member 11. Also with the structure in which in the Z direction, the depth D1 of the portion of the recess 16 that is on the rear surface 114 side is greater than the depth D2 of the portion of the recess 16 that is on the front surface 113 side, the opening of the recess 16 can have an increased area size at the rear surface 114 of the base member 11. The light emitting device 1000 and the support substrate may be joined to each other in the state where the rear surface 114 of the base member 11 and a top surface of the support substrate face each other. In this case, with the structure in which the area size of the opening of the recess 16 at the rear surface 114 of the base member 11, which faces the support substrate, is large, the joining member that is positioned on the rear surface 114 side of the base member 11 can have an increased area size. This can increase the joining strength between the light emitting device 1000 and the support substrate.

As an example of structure of the first light emitting element 20A and the second light emitting element 20B, a structure of the first light emitting element 20A will be described. The first light emitting element 20A includes a first light extraction surface 201A, a first electrodes formation surface 203A positioned opposite to the first light extraction surface 201A, and a first lateral surface 202A located between the first light extraction surface 201A and the first electrodes formation surface 203A. The first light extraction surface 201A is a top surface of the first light emitting element 20A. The first lateral surface 202A is a lateral surface of the light emitting element 20A. The first lateral surface 202A may be perpendicular to the first light extraction surface 201A or may be inclined inward or outward with respect to the first light extraction surface 201A. The first electrodes formation surface 203A is a bottom surface of the first light emitting element 20A. A pair of electrodes 21A and 22A are provided on the first electrodes formation surface 203A. One of the pair of electrodes 21A and 22A, more specifically, the electrode 21A, is electrically connected with the first wiring portion 12A via the conductive bonding member 60, whereas the other of the pair of electrodes 21A and 22A, more specifically, the electrode 22A, is electrically connected with the second wiring portion 12B via the conductive bonding member 60.

Similarly, the second light emitting element 20B includes a second light extraction surface 201B, a second electrodes formation surface positioned opposite to the second light extraction surface 201B, and a second lateral surface located between the second light extraction surface 201B and the second electrodes formation surface. A pair of electrodes 21B and 22B are provided on the second electrodes formation surface. One of the pair of electrodes 21B and 22B, more specifically, the electrode 21B, is electrically connected with the third wiring portion 12C via the conductive bonding member 60, whereas the other of the pair of electrodes 21B and 22B, more specifically, the electrode 22B, is electrically connected with the fourth wiring portion 12D via the conductive bonding member 60.

The first light emitting element 20A includes a first element substrate 24A, a first semiconductor stack body 23A formed in contact with the first element substrate 24A and the pair of electrodes 21A and 22A formed in contact with the first semiconductor stack body 23A. In this embodiment, the first light emitting element 20A includes the first element substrate 24A. Alternatively, the first light emitting element 20A does not need to include the first element substrate 24A. In the case where the first light emitting element 20A includes the first element substrate 24A, the "first light extraction surface 201A" refers to a top surface of the first element substrate 24A that is positioned opposite to the first electrodes formation surface 203A. In the case where the first light emitting element 20A does not include the first element substrate 24A, the "first light extraction surface 201A" refers to a top surface of the first semiconductor stack body 23A that is positioned opposite to the first electrodes formation surface 203A, on which the pair of electrodes 21A and 22A are provided.

It is preferable that the first light emitting element 20A and the second light emitting element 20B are located side by side in the first direction. In other words, it is preferable that at least a part of the first light emitting element 20A and at least a part of the second light emitting element 20B are located on a straight line extending in the first direction. With such an arrangement, the light emitting device 1000 can be reduced in size in the second direction.

In this embodiment, the light emitting device 1000 includes two light emitting elements, more specifically, the first light emitting element 20A and the second light emitting element 20B. Alternatively, the light emitting device 1000 may include three or more light emitting elements.

The first light emitting element 20A and the second light emitting element 20B may emit light having the same peak wavelength as each other, or may emit light having different emission peak wavelengths from each other. In the case where, for example, the first light emitting element 20A and the second light emitting element 20B emit light having the same emission peak wavelength as each other, the emission peak wavelength of the light emitted by the first light emitting element 20A and the second light emitting element 20B may be in the range of 430 nm or longer and shorter than 490 nm (i.e., wavelength range of blue light). In the case where the first light emitting element 20A and the second light emitting element 20B emit light having different emission peak wavelengths from each other, the emission peak wavelength of the light emitted by the first light emitting element 20A may be in the range of 430 nm or longer and shorter than 490 nm (i.e., wavelength range of blue light), whereas the emission peak wavelength of the light emitted by the second light emitting element 20B may be in the range of 490 nm or longer and 570 nm or shorter (i.e., wavelength range of green light). With such an arrangement, the light emitting device 1000 can have an improved color reproducibility. In this specification, as long as the difference between the emission peak wavelength of the light emitted by one of the light emitting elements (e.g., first light emitting element 20A) and the emission peak wavelength of the light emitted by another light emitting element (e.g., second light emitting element 20B) is within ±10 nm, it is expressed that "the emission peak wavelength of the light emitted by one of the light emitting elements and the emission peak wavelength of the light emitted by the other light emitting element is the same as each other".

In the second direction, the first light emitting element 20A may have a maximum width narrower than each of a maximum width of the first wiring portion 12A and a maximum width of the second wiring portion 12B. In the second direction, as shown in FIG. 5A, the maximum width of the first light emitting element 20A may be equal to each of the maximum width of the first wiring portion 12A and the maximum width of the second wiring portion 12B.

Figure 5B:
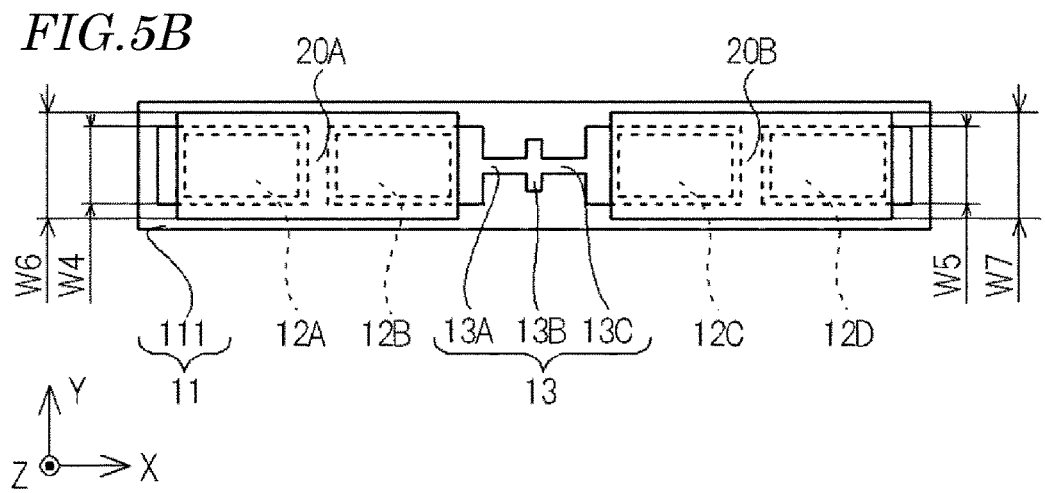
FIG. 5B is a schematic top view of a modification of the substrate, the first light emitting element and the second light emitting element according to the embodiment.

Alternatively, in the second direction, as shown in FIG. 5B, the maximum width (represented by W6) of the first light emitting element 20A may be wider than the maximum width W4 of each of the first wiring portion 12A and the second wiring portion 12B. Even in the case where the first light emitting element 20A makes the first wiring portion 12A and/or the second wiring portion 12B unviewable, the first light emitting element 20A can be placed using the connection wiring portion 13 as a reference. Therefore, the positional precision of the first light emitting element 20A with respect to the substrate 10 can be improved.

In the second direction, the second light emitting element 20B may have a maximum width narrower than each of the maximum width of the third wiring portion 12C and a maximum width of the fourth wiring portion 12D. In the second direction, as shown in FIG. 5A, the maximum width of the second light emitting element 20B may be equal to each of the maximum width of the third wiring portion 12C and the maximum width of the fourth wiring portion 12D.

Alternatively, in the second direction, as shown in FIG. 5B, the maximum width (represented by W7) of the second light emitting element 20B may be wider than the maximum width W5 of each of the third wiring portion 12C and the fourth wiring portion 12D. Even in the case where the second light emitting element 20B makes the third wiring portion 12C and/or the fourth wiring portion 12D unviewable, the second light emitting element 20B can be placed using the connection wiring portion 13 as a reference. Therefore, the positional precision of the second light emitting element 20B with respect to the substrate 10 can be improved.

Referring to FIG. 2B, the cover member 40 covers the top surface 111 of the base member 11, the first lateral surface 202A of the first light emitting element 20A and the second lateral surface 202B of the second light emitting element 20B. The cover member 40 is in contact with the top surface 111 of the base member 11 and the connection wiring portion 13. The provision of the cover member 40 can protect the base member 11, the first light emitting element 20A and the second light emitting element 20B against an external force. The cover member 40 may contain a white pigment in a base material containing a resin material.

The base material of the cover member 40 is formed of, for example, a silicone resin, an epoxy resin, a phenol resin, a polycarbonate resin, an acrylic resin or a modified resin thereof. It is especially preferable to use an epoxy resin as the material of the cover member 40 because use of an epoxy resin can increase the strength of the light emitting device 1000 than use of a silicone resin. A silicone resin and a modified resin thereof, which are highly resistant against heat and light, are also preferable as the base material of the cover member 40.

The white pigment usable for the cover member 40 may be formed of a single material or a combination of two or more materials among, for example, titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. The white pigment may have an appropriate shape, and may be irregular or crushed. It is preferable that the white pigment is spherical from the point of view of the fluidity. It is preferable that the white pigment has an average particle size of, for example, about 0.1 µm or longer and about 0.5 µm or shorter. It is preferable that the particle size of the white pigment is as short as possible in order to improve the light reflectance and the effect of covering. The content of the white pigment in the cover member 40 may be of any appropriate value, and is, for example, preferably 10 wt. % or higher and 80 wt. % or lower, more preferably 20 wt. % or higher and 70 wt. % or lower, and still more preferably 30 wt. % or higher and 60 wt. % or lower, from the points of view of the light reflectance, the viscosity in a liquid state and the like. The term "wt. %" herein refers to percent by weight, and represents the weight ratio of a material of interest with respect to the total weight of the cover member 40.

In the case where the cover member 40 contains a white pigment or the like and is reflective, with the structure in which the cover member 40 covers the first lateral surface 202A of the first light emitting element 20A and the second lateral surface 202B of the second light emitting element 20B, the contrast between a light emitting region and a non-light emitting region is improved. Therefore, the light emitting device 1000 can have a highly clear border between the light emitting region and the non-light emitting region.

As shown in FIG. 2B, the light emitting device 1000 may include a first light-transmissive member 30A covering the top surface of the first light emitting element 20A (i.e., the first light extraction surface 201A). With the structure in which the top surface of the first light emitting element 20A is covered with the first light-transmissive member 30A, the first light emitting element 20A can be protected against an external force. Similarly, the light emitting device 1000 may include a second light-transmissive member 30B covering a top surface of the second light emitting element 20B (i.e., the second light extraction surface 201B). With the structure in which the top surface of the second light emitting element 20B is covered with the second light-transmissive member 30B, the second light emitting element 20B can be protected against an external force.

In the case where the cover member 40 is reflective, it is preferable that the cover member 40 covers a lateral surface of the first light-transmissive member 30A and/or the second light-transmissive member 30B. Such a structure improves the contrast between a light emitting region and a non-light emitting region. Therefore, the light emitting device 1000 can have a highly clear border between the light emitting region and the non-light emitting region. Hereinafter, the first light-transmissive member 30A and/or the second light-transmissive member 30B may be referred to simply as a "light-transmissive member(s)".

As an example of structure of the first light-transmissive member 30A and the second light-transmissive member 30B, a structure of the first light-transmissive member 30A will be described. The first light-transmissive member 30A may be located in contact with the top surface of the first light emitting element 20A. Alternatively, as shown in FIG. 2B, the first light-transmissive member 30A may cover the top surface of the first light emitting element 20A via a light guide member 50. The light guide member 50 may be positioned only between the top surface of the first light emitting element 20A and the first light-transmissive member 30A to secure the first light emitting element 20A and the first light-transmissive member 30A to each other. Alternatively, the light guide member 50 may cover the first light extraction surface 201A of the light emitting element 20A and also the first lateral surface 202A of the first light emitting element 20A to secure the first light emitting element 20A and the first light-transmissive member 30A to each other. In the case where the light guide member 50 has a higher transmittance to light from the first light emitting element 20A than that of the cover member 40, with the structure in which the light guide member 50 covers the first lateral surface 202A of the first light emitting element 20A as well as the first light extraction surface 201A, light emitted from the first lateral surface 202A of the first light emitting element 20A is easily extracted to the outside of the light emitting device 1000 via the light guide member 50. This can improve the light extraction efficiency. In the case where the light guide member 50 covers the first lateral surface 202A of the first light emitting element 20A as well as the first light extraction surface 201A, the cover member 40 may cover the first lateral surface 202A of the first light emitting element 20A via the light guide member 50.

The first light-transmissive member 30A may contain wavelength conversion particles. This allows color adjustment of the light emitting device 1000 to be performed easily. The wavelength conversion particles absorb at least a part of primary light emitted by the light emitting element(s) (i.e., the first light emitting element 20A and/or the second light emitting element 20B) and emit secondary light having a wavelength different from that of the primary light. With the structure in which the first light-transmissive member 30A contains the wavelength conversion particles, mixed color light including a mixture of the primary light emitted by the first light emitting element 20A and the secondary light emitted by the wavelength conversion particles can be output. For example, a blue LED may be used for the first light emitting element 20A, and a phosphor such as YAG or the like may be used for the wavelength conversion particles. In this case, the light emitting device 1000 can output white light obtained as a result of mixing blue light from the blue LED and yellow light emitted by the phosphor excited by the blue light. Alternatively, a blue LED may be used for the first light emitting element 20A, and a β-SiAlON-based phosphor, which is a green phosphor, and a manganese-activated fluoride-based phosphor, which is a red phosphor, may be used for the wavelength conversion particles. In this case also, the light emitting device 1000 can output white light.

The wavelength conversion particles may be dispersed uniformly in the first light-transmissive member 30A, or may be locally positioned closer to the first light emitting element 20A than to a top surface of the first light-transmissive member 30A. In the case where the wavelength conversion particles are locally positioned closer to the first light emitting element 20A than to the top surface of the first light-transmissive member 30A, even if the wavelength conversion particles, which are weak against moisture, are used, a base material of the first light-transmissive member 30A serves as a protective layer. This can suppress deterioration of the wavelength conversion particles.

As shown in FIG. 2B, the first light-transmissive member 30A may include layers 31A and 32A containing the wavelength conversion particles and a layer 33A containing substantially no wavelength conversion particles. The expression "contains substantially no wavelength conversion particles" indicates that unavoidable contamination with the wavelength conversion particles is not eliminated. It is preferable that the first light-transmissive member 30A has a content of the wavelength conversion particles of 0.05% by weight or lower.

The layer 33A may be positioned at a level, in the Z direction, higher than the layers 31A and 32A. With such a structure, the layer 33A may serve as a protective layer, and thus may suppress deterioration of the wavelength conversion particles. Examples of the material of the wavelength conversion particles weak against moisture include a manganese-activated fluoride-based phosphor. The manganese-activated fluoride-based phosphor emits light having a relatively narrow spectral line width, which is preferable from the point of view of color reproducibility.

The first light-transmissive member 30A may include a single layer or a plurality of layers containing the wavelength conversion particles. For example, as shown in FIG. 2B, the first light-transmissive member 30A may include the first wavelength conversion layer 31A and the second wavelength conversion layer 32A covering the first wavelength conversion layer 31A. The second wavelength conversion layer 32A may directly cover the first wavelength conversion layer 31A, or may cover the first wavelength conversion layer 31A via another light-transmissive layer. The first wavelength conversion layer 31A is located closer to the first light extraction surface 201A of the first light emitting element 20A than the second wavelength conversion layer 32A.

It is preferable that the wavelength conversion particles contained in the first wavelength conversion layer 31A emit light having an emission peak wavelength shorter than an emission peak wavelength of light emitted by the wavelength conversion particles contained in the second wavelength conversion layer 32A. With such an arrangement, the wavelength conversion particles contained in the second wavelength conversion layer 32A can be excited by the light from the first wavelength conversion layer 31A, which is excited by the first light emitting element 20A. This can increase the amount of light from the wavelength conversion particles in the second wavelength conversion layer 32A.

It is preferable that the emission peak wavelength of the light emitted by the wavelength conversion particles contained in the first wavelength conversion layer 31A is 500 nm or longer and 570 nm or shorter, and that the emission peak wavelength of the light emitted by the wavelength conversion particles contained in the second wavelength conversion layer 32A is 610 nm or longer and 750 nm or shorter. With such an arrangement, the light emitting device 1000 can have a high color reproducibility. For example, the wavelength conversion particles contained in the first wavelength conversion layer 31A may be formed of a β-SiAlON-based phosphor, and the wavelength conversion particles contained in the second wavelength conversion layer 32A may be formed of a phosphor of manganese-activated potassium fluorosilicate. In the case where the wavelength conversion particles contained in the second wavelength conversion layer 32A is formed of a phosphor of manganese-activated potassium fluorosilicate, it is especially preferable that the first light-transmissive member 30A includes the first wavelength conversion layer 31A and the second wavelength conversion layer 32A. The phosphor of manganese-activated potassium fluorosilicate is likely to cause brightness saturation. However, the first wavelength conversion layer 31A positioned between the second wavelength conversion layer 32A and the first light emitting element 20A can suppress the phosphor of manganese-activated potassium fluorosilicate from being excessively irradiated with the light from the first light emitting element 20A. This can suppress deterioration of the phosphor of manganese-activated potassium fluorosilicate.

The first light-transmissive member 30A may contain first wavelength conversion particles that absorb at least a part of primary light emitted by the first light emitting element 20A and emit secondary light by forbidden transition, and second wavelength conversion particles that absorb at least a part of the primary light emitted by the first light emitting element 20A and emit the secondary light by allowed transition. In general, the first wavelength conversion particles that emit the secondary light by forbidden transition has a longer afterglow time than that of the second wavelength conversion particles that emit the secondary light by allowed transition. Therefore, in the case where the first light-transmissive member 30A contains both of the first wavelength conversion particles and the second wavelength conversion particles, the afterglow time can be shorter than in the case where the first light-transmissive member 30A contains only the first wavelength conversion particles.

The first wavelength conversion particles may be formed of, for example, a phosphor of manganese-activated potassium fluorosilicate (e.g., $K_2SiF_6$: Mn), and the second wavelength conversion particles may be formed of, for example, a CASN-based phosphor. In the case where the first light-transmissive member 30A contains a CASN-based phosphor and a phosphor of manganese-activated potassium fluorosilicate, the afterglow time can be shorter than in the case where the first light-transmissive member 30A contains only a phosphor of manganese-activated potassium fluorosilicate. In general, manganese-activated potassium fluorosilicate emits light having an emission peak having a narrower half width than that of light emitted by a CASN-based phosphor, and thus provides a higher color purity and a higher color reproducibility. Therefore, in the case where the first light-transmissive member 30A contains a CASN-based phosphor and a phosphor of manganese-activated potassium fluorosilicate, the color reproducibility is higher than in the case where the first light-transmissive member 30A contains only a CASN-based phosphor.

For example, the weight of the phosphor of manganese-activated potassium fluorosilicate contained in the first light-transmissive member 30A is preferably at least 0.5 times and at most 6 times the weight of the CASN-based phosphor, is more preferably at least equal to, and at most 5 times, the weight of the CASN-based phosphor, and is still more preferably at least twice and at most 4 times the weight of the CASN-based phosphor. Increasing the weight of the phosphor of manganese-activated potassium fluorosilicate improves the color reproducibility of the light emitting device 1000. On the other hand, increasing the weight of the CASN-based phosphor can shorten the afterglow time.

It is preferable that the phosphor of manganese-activated potassium fluorosilicate has an average particle size of 5 μm or longer and 30 μm or shorter. It is preferable that the CASN-based phosphor has an average particle size of 5 μm or longer and 30 μm or shorter. With the structure in which the phosphor of manganese-activated potassium fluorosilicate and/or the CASN-based phosphor has an average particle size of 30 μm or shorter, light from the first light emitting element 20A is easily diffused by the wavelength conversion particles. This can suppress the color non-uniformity of distributed light of the light emitting device 1000. With the structure in which the phosphor of manganese-activated potassium fluorosilicate and/or the CASN-based phosphor has an average particle size of 5 μm or longer, the light is easily extracted from the first light emitting element 20A. This improves the light extraction efficiency of the light emitting device 1000.

The CASN-based phosphor and the phosphor of manganese-activated potassium fluorosilicate may be contained in the same wavelength conversion layer of the first light-transmissive member 30A. In the case where the first light-transmissive member 30A includes a plurality of wavelength conversion layers, the CASN-based phosphor and the phosphor of manganese-activated potassium fluorosilicate may be contained in different wavelength conversion layers from each other. In the case where the phosphor of manganese-activated potassium fluorosilicate and the CASN-based phosphor are contained in different wavelength conversion layers from each other, it is preferable that the wavelength conversion particles that emit light having a shorter emission peak wavelength are positioned closer to the first light emitting element 20A. With such an arrangement, the wavelength conversion particles emitting light having a longer emission peak wavelength can be excited by light from the wavelength conversion particles having a shorter emission peak wavelength. Since the emission peak wavelength of light emitted by the phosphor of manganese-activated potassium fluorosilicate is around 631 nm and the emission peak wavelength of light emitted by the CASN-based phosphor is around 650 nm, in the case where the CASN-based phosphor and the phosphor of manganese-activated potassium fluorosilicate are contained in the first light-transmissive member 30A, it is preferable that the wavelength conversion particles formed of the phosphor of manganese-activated potassium fluorosilicate are positioned closer to the first light emitting element 20A.

The second wavelength conversion particles may alternatively be formed of a SCASN-based phosphor, a SLAN phosphor ($SrLiAl_3N_4$: Eu) or the like. For example, the first light-transmissive member 30A may contain a SLAN-based phosphor and a phosphor of manganese-activated potassium fluorosilicate. Alternatively, the first light-transmissive member 30A may contain the first wavelength conversion particles and the second wavelength conversion particles both formed of a red phosphor and also contain a β-SiAlON-based phosphor, which is a green phosphor. Such an arrangement improves the color reproducibility of the light emitting device 1000.

The wavelength conversion particles contained in the first light-transmissive member 30A and the wavelength conversion particles contained in the second light-transmissive member 30B may be of the same material or of different materials. In the case where the light emitting device includes the first light emitting element 20A emitting light having an emission peak wavelength in the range of 430 nm or longer and shorter than 490 nm (i.e., wavelength range of blue light) and the second light emitting element 20B emitting light having an emission peak wavelength in the range of 490 nm or longer and 570 nm or shorter (i.e., wavelength range of green light), the first light-transmissive member 30A may contain the wavelength conversion particles formed of a red phosphor, whereas the second light-transmissive member 30B may contain substantially no wavelength conversion particles. With such an arrangement, the light emitting device can have an improved color reproducibility. Light from the second light emitting element 20B is not blocked by the wavelength conversion particles, and therefore, the light extraction efficiency of the light emitting device can be improved. Examples of the red phosphor usable for the wavelength conversion particles contained in the first light-transmissive member 30A include a manganese-activated fluoride-based phosphor.

Figure 6:
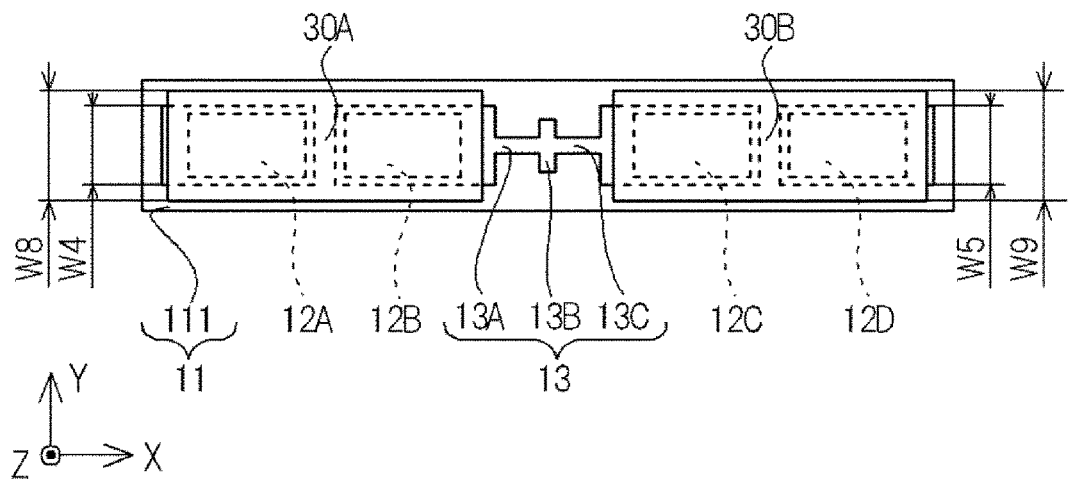
FIG. 6 is a schematic top view of the substrate, a first light-transmissive member and a second light-transmissive member according to the embodiment.

In the second direction, the first light-transmissive member 30A may have a maximum width narrower than each of the maximum width of the first wiring portion 12A and the maximum width of the second wiring portion 12B. In the second direction, the maximum width of the first light-transmissive member 30A may be equal to each of the maximum width of the first wiring portion 12A and the maximum width of the second wiring portion 12B. Alternatively, as shown in FIG. 6, in the second direction, the maximum width (represented by W8) of the first light-transmissive member 30A may be wider than the maximum width W4 of each of the first wiring portion 12A and the second wiring portion 12B. Even in the case where the first light-transmissive member 30A overlaps the first wiring portion 12A and/or the second wiring portion 12B, the first light-transmissive member 30A can be placed on the top surface of the first light emitting element 20A using the connection wiring portion 13 as a reference. Therefore, the positional precision of the first light-transmissive member 30A with respect to the substrate 10 can be improved.

Similarly, in the second direction, the second light-transmissive member 30B may have a maximum width narrower than each of the maximum width of the third wiring portion 12C and the maximum width of the fourth wiring portion 12D. In the second direction, the maximum width of the second light-transmissive member 30B may be equal to each of the maximum width of the third wiring portion 12C and the maximum width of the fourth wiring portion 12D. Alternatively, as shown in FIG. 6, in the second direction, the maximum width (represented by W9) of the second light-transmissive member 30B may be wider than the maximum width W5 of each of the third wiring portion 12C and the fourth wiring portion 12D. Even in the case where the second light-transmissive member 30B overlaps the third wiring portion 12C and/or the fourth wiring portion 12D, the second light-transmissive member 30B can be placed on the top surface of the second light emitting element 20B using the connection wiring portion 13 as a reference. Therefore, the positional precision of the second light-transmissive member 30B with respect to the substrate 10 can be improved.

Figure 7:
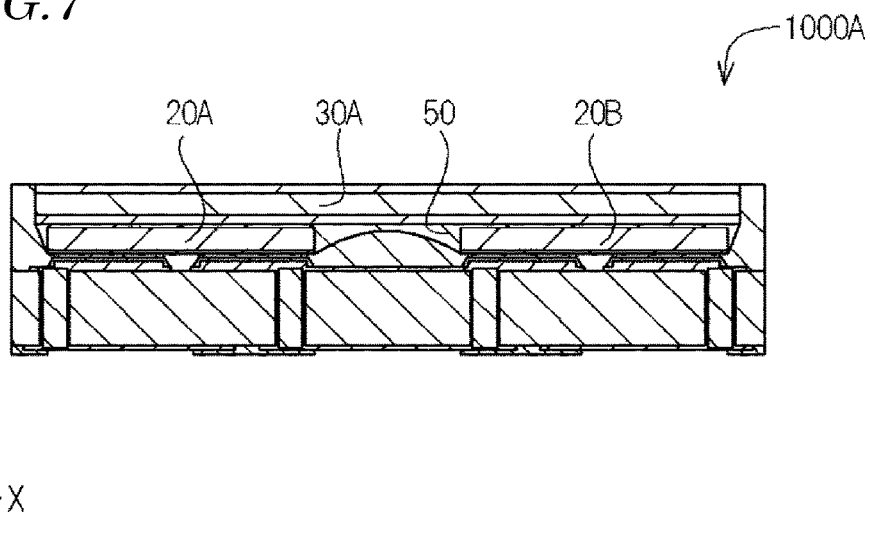
FIG. 7 is a schematic cross-sectional view of a modification of the light emitting device according to the embodiment.

As in a light emitting device 1000A shown in FIG. 7, one first light-transmissive element 30A may cover the top surface of the first light emitting element 20A and the top surface of the second light emitting element 20B. Such a structure allows light from the first light emitting element 20A and light from the second light emitting element 20B to be guided to the first light-transmissive element 30A, and thus can alleviate the unevenness in luminance between the region directly above the first light emitting element 20A and the region directly above the second light emitting element 20B.

Figure 1B:
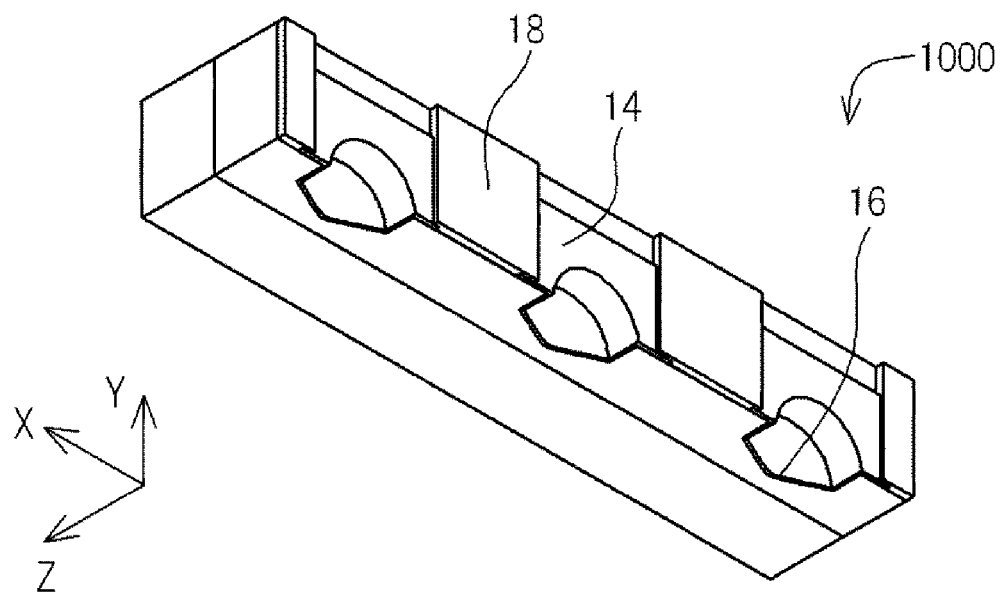
FIG. 1B is a schematic perspective view of the light emitting device according to the embodiment.

As shown in FIG. 1B, the light emitting device may include an insulating film 18 covering a part of the fifth wiring portion 14. The provision of the insulating film 18 can guarantee the insulating property of, and prevent short-circuiting of, the bottom surface 112. The provision of the insulating film 18 can also prevent delamination of the fifth wiring portion 14 from the base member 11.

Figure 8:
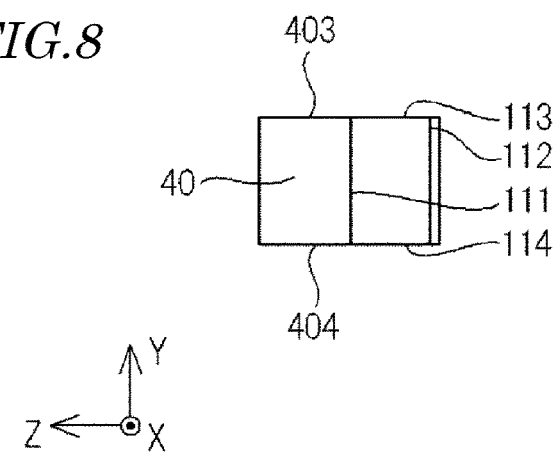
FIG. 8 is a schematic side view of the light emitting device according to the embodiment.
Figure 9:
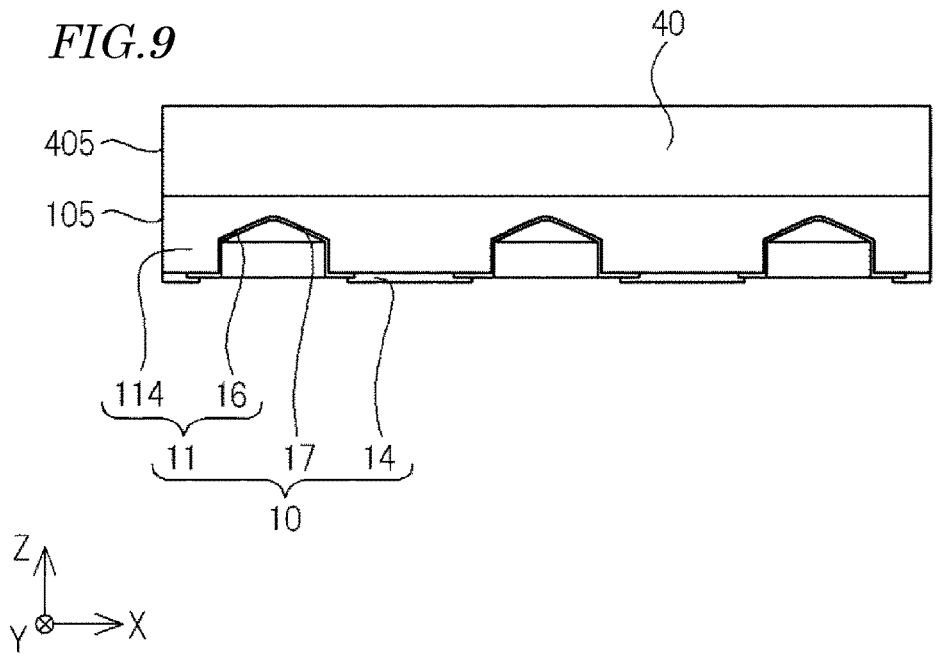
FIG. 9 is a schematic rear view of the substrate according to the embodiment.

It is preferable that as shown in FIG. 8, the front surface 113 of the base member 11 and an outer lateral surface 403 of the cover member 40 are flush with each other. It is preferable that the rear surface 114 of the base member 11 and an outer lateral surface 404 of the cover member 40 are flush with each other. Such a structure can reduce the size of the light emitting device. It is preferable that as shown in FIG. 9, a lateral surface 105 of the base member 11 and an outer lateral surface 405 of the cover member 40 are flush with each other. Such a structure can reduce the size of the light emitting device.

Now, a method of producing a light emitting device according to an embodiment of the present disclosure will be described with reference to FIG. 10A through FIG. 15.

The method of producing the light emitting device may include the following steps:

(1) providing a substrate including a base member containing a resin material and having a top surface, a first wiring portion, a second wiring portion, a third wiring portion and a fourth wiring portion that are located on the top surface of the base member, and arrayed in a first direction, and a connection wiring portion connecting the second wiring portion and the third wiring portion to each other, wherein the connection wiring portion includes a first connection end connected with the second wiring portion, a second connection end connected with the third wiring portion and a connection central portion connecting the first connection end and the second connection end to each other, wherein the connection central portion has a maximum width, in a second direction perpendicular to the first direction, that is different from each of a maximum width of the first connection end and a maximum width of the second connection end, and wherein the connection wiring portion includes a portion that is narrower than each of a maximum width of the second wiring portion and a maximum width of the third wiring portion in the second direction;

(2) placing a first light emitting element on the first wiring portion and the second wiring portion using the connection wiring portion as a reference;

(3) placing a second light emitting element on the third wiring portion and the fourth wiring portion using the connection wiring portion as a reference; and (4) forming a cover member covering the top surface of the base member, a lateral surface of the first light emitting element and a lateral surface of the second light emitting element.

Hereinafter, each of the steps will be described.

[Step of Providing the Substrate]

Figure 10A:
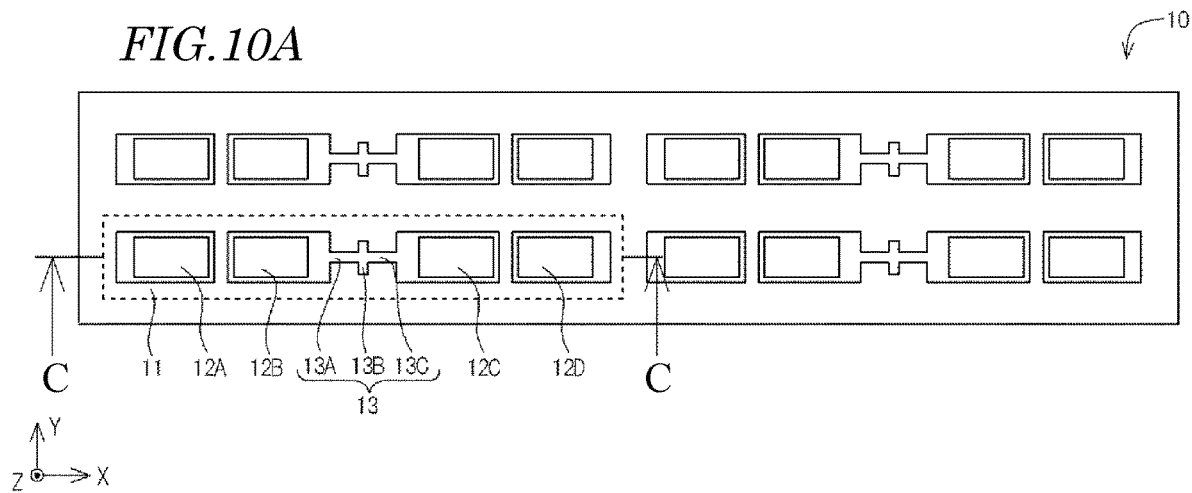
FIG. 10A is a schematic top view illustrating a method of producing light emitting devices according to the embodiment.
Figure 10B:
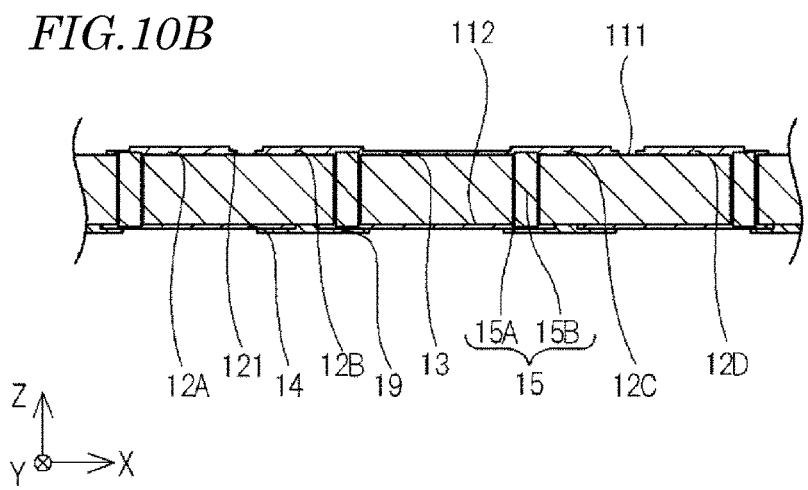
FIG. 10B is a schematic cross-sectional view taken along line C-C in FIG. 10A.

As shown in FIG. 10A, a substrate is provided. The substrate may be in a state of being divided into individual substrates 10, or in an integral state before being divided into the individual substrates 10 as shown in FIG. 10A. In this specification, an individual substrate after the division and a substrate in the integral state before the division may both be referred to as a "substrate". The substrate 10 contains a resin material, and includes the base member 11 having the top surface 111. As shown in FIG. 10B, the first wiring portion 12A, the second wiring portion 12B, the third wiring portion 12C and the fourth wiring portion 12D are arrayed in the first direction on the top surface 111 of the base member 11. On the top surface 111 of the base member 11, the connection wiring portion 13 connecting the second wiring portion 12B and the third wiring portion 12C to each other is located. The connection wiring portion 13 includes the first connection end 13A connected with the second wiring portion 12B, the second connection end 13C connected with the third wiring portion 12C, and the connection central portion 13B connecting the first connection end 13A and the second connection end 13C to each other. The connection central portion 13B has a maximum width in the second direction perpendicular to the first direction. The a maximum width of the connection central portion 13B is different from each of the maximum width of the first connection end 13A and the maximum width of the second connection end 13C. The connection central portion 13B may have any of various shapes described above. It is preferable that a gold plating layer formed by electrolytic plating is positioned at the outermost surface of each of the first wiring portion 12A, the second wiring portion 12B, the third wiring portion 12C, the fourth wiring portion 12D and the connection wiring portion 13 of the substrate 10.

The base member 11 may include a recess opened in the bottom surface 112. In the case where the rear surface 114 of the base member 11 is formed by the step of dividing into individual substrates described below, the recess may be opened only in the bottom surface 112 before being divided into the individual substrates 10. The substrate 10 may include the fifth wiring portion 14, the sixth wiring portion 17, and the vias 15 as described above.

[Step of Placing the First Light Emitting Element]

Figure 11A:
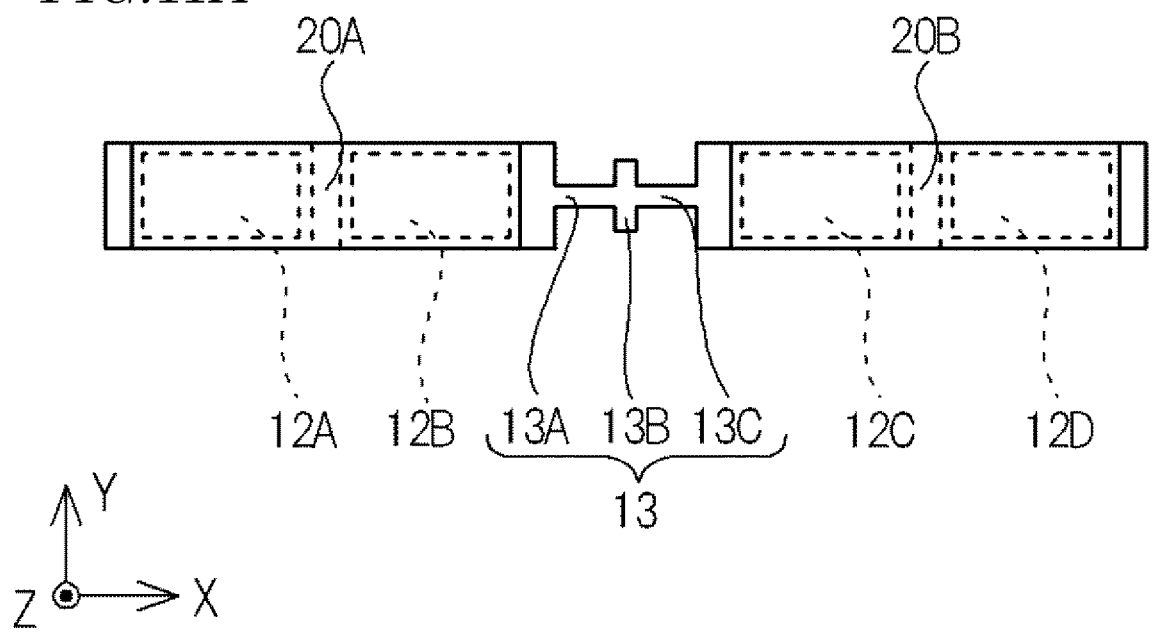
FIG. 11A is a schematic top view illustrating the method of producing the light emitting devices according to the embodiment.
Figure 11B:
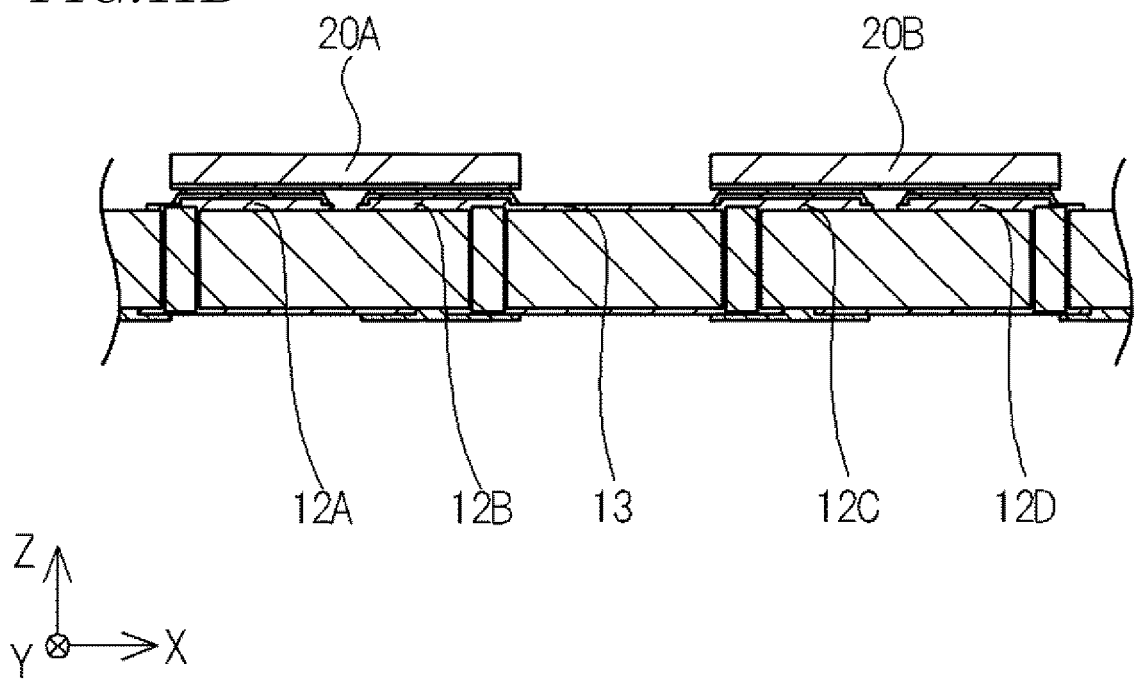
FIG. 11B is a schematic cross-sectional view illustrating the method of producing the light emitting devices according to the embodiment.

As shown in FIG. 11A and FIG. 11B, the first light emitting element 20A is placed on the first wiring portion 12A and the second wiring portion 12B using the connection wiring portion 13 as a reference. Use of the connection wiring portion 13 as a reference can improve the positional precision of the first light emitting element 20A with respect to the substrate 10. As seen in a top view, the first wiring portion 12A and the second wiring portion 12B overlap the first light emitting element 20A. Therefore, it may be difficult to use the first wiring portion 12A and/or the second wiring portion 12B as a reference to place the first light emitting element 20A. However, the connection wiring portion 13, the position of which is easily recognizable, can be used as the reference.

[Step of Placing the Second Light Emitting Element]

As shown in FIG. 11A and FIG. 11B, the second light emitting element 20B is placed on the third wiring portion 12C and the fourth wiring portion 12D using the connection wiring portion 13 as a reference. Use of the connection wiring portion 13 as a reference can improve the positional precision of the second light emitting element 20B with respect to the substrate 10. As seen in a top view, the third wiring portion 12C and the fourth wiring portion 12D overlap the second light emitting element 20B. Therefore, it may be difficult to use the third wiring portion 12C and/or the fourth wiring portion 12D as a reference to place the second light emitting element 20B. However, the connection wiring portion 13, the position of which is easily recognizable, can be used as the reference. Either one of the step of placing the first light emitting element 20A and the step of placing the second light emitting element 20B may be performed first.

[Step of Forming the First Light-Transmissive Member]

Figure 12A:
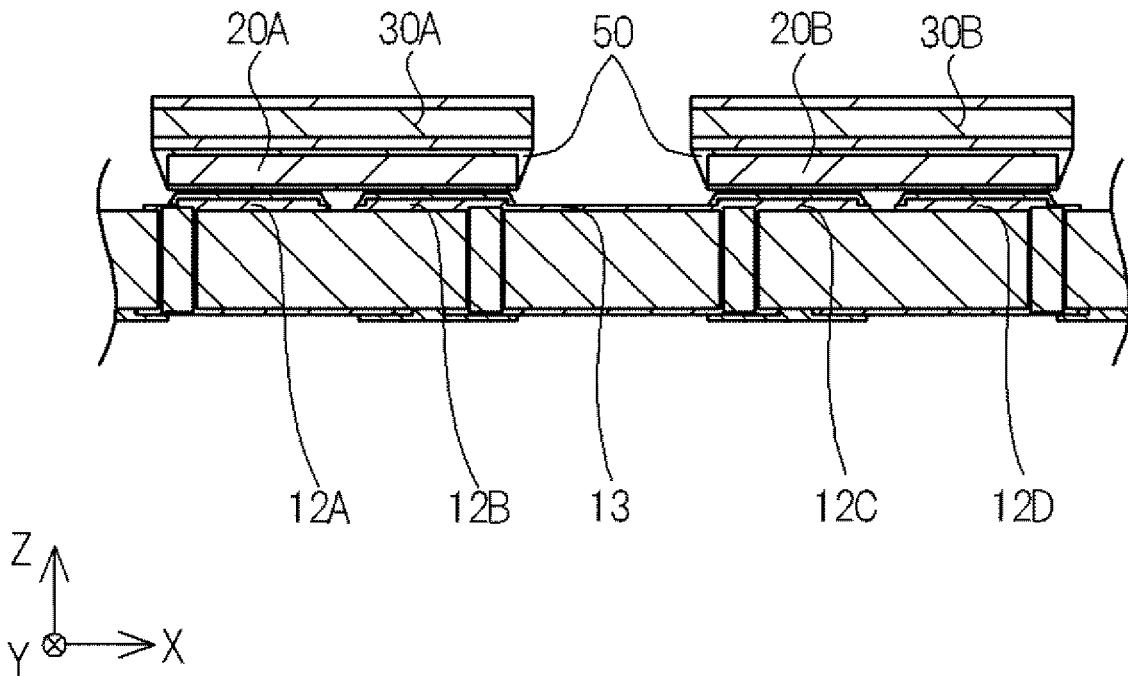
FIG. 12A is a schematic cross-sectional view illustrating the method of producing the light emitting devices according to the embodiment.

As shown in FIG. 12A, the first light-transmissive member 30A may be formed to cover the top surface of the first light emitting element 20A. The first light-transmissive member 30A may cover the top surface of the first light emitting element 20A via the light guide member 50. In the present embodiment, the step of forming the first light-transmissive member 30A is performed after the step of placing the first light emitting element 20A and before the step of forming the cover member 40 described below.

Figure 12B:
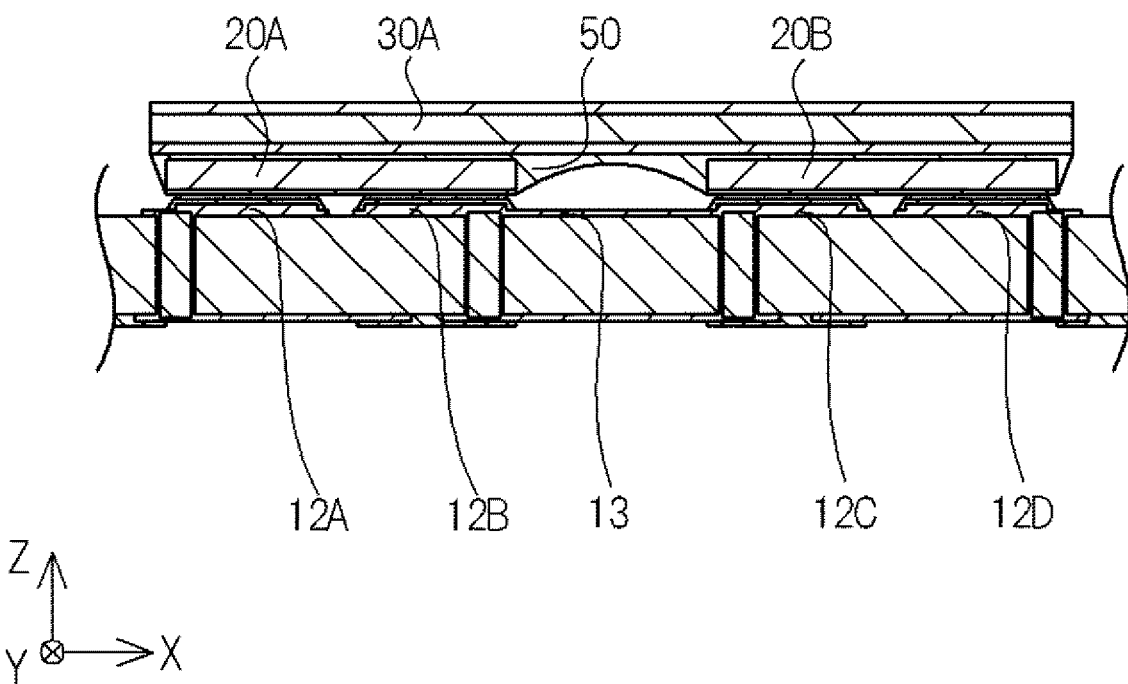
FIG. 12B is a schematic cross-sectional view illustrating the method of producing a modification of the light emitting devices according to the embodiment.

As shown in FIG. 12B, the first light-transmissive member 30A may be formed to cover the top surface of the first light emitting element 20A and the top surface of the second light emitting element 20B. In this case, the step of forming the first light-transmissive member 30A may be performed after the step of placing the first light emitting element 20A and the step of placing the second light emitting element 20B and before the step of forming the cover member 40 described below. The first light-transmissive member 30A may cover the top surface of the first light emitting element 20A and the top surface of the second light emitting element 20B via the light guide member 50.

[Step of Forming the Second Light-Transmissive Member]

As shown in FIG. 12A, the second light-transmissive member 30B may be formed to cover the top surface of the second light emitting element 20B. The second light-transmissive member 30B may cover the top surface of the second light emitting element 20B via the light guide member 50. The step of forming the second light-transmissive member 30B may be performed after the step of placing the second light emitting element 20B and before the step of forming the cover member 40 described below.

[Step of Forming the Cover Member]

Figure 13:
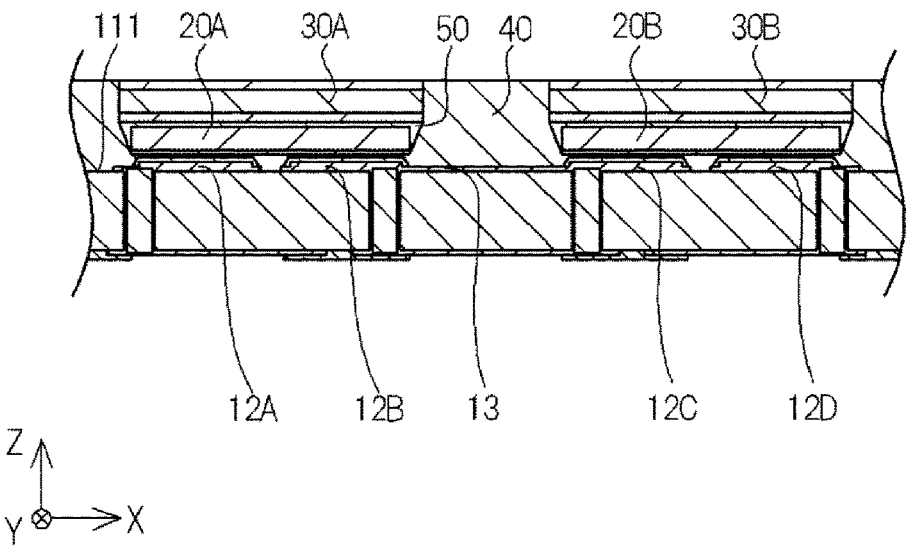
FIG. 13 is a schematic cross-sectional view illustrating the method of producing the light emitting devices according to the embodiment.

As shown in FIG. 13, the cover member 40 covering the top surface 111 of the base member 11, the first lateral surface 202A of the first light emitting element 20A and the second lateral surface 202B of the second light emitting element 20B is formed. The cover member 40 may cover the first lateral surface 202A of the first light emitting element 20A and the second lateral surface 202B of the second light emitting element 20B via the light guide member 50. The cover member 40 may cover the lateral surface of the first light-transmissive member 30A and/or a lateral surface of the second light-transmissive member 30B. The cover member 40 may be formed so as to cover the top surface of the first light-transmissive member 30A and/or the top surface of the second light-transmissive member 30B. Thereafter, a part of the cover member 40 may be removed to expose the top surface of the first light-transmissive member 30A and/or the top surface of the second light-transmissive member 30B from the cover member 40. In the case where an addition reaction type silicone resin containing a platinum-based catalyst is used for the cover member 40, it is preferable that a gold plating layer formed by electrolytic plating is provided at the outermost surface of each of the first wiring portion 12A, the second wiring portion 12B, the third wiring portion 12C, the fourth wiring portion 12D, the connection wiring portion 13 and the fifth wiring portion 14 of the substrate 10. The cover member 40 may be formed by a known method such as transfer molding or the like.

[Step of Dividing into Individual Substrates]

In the case where the cover member 40 is formed while the substrate 10 is in an integral state before the division, at least a part of the substrate 10 and at least a part of the cover member 40 are removed through cutting or the like after the step of forming the cover member 40 to provide a plurality of individual light emitting devices. In this manner, the light emitting device according to this embodiment can be produced.

Figure 14:
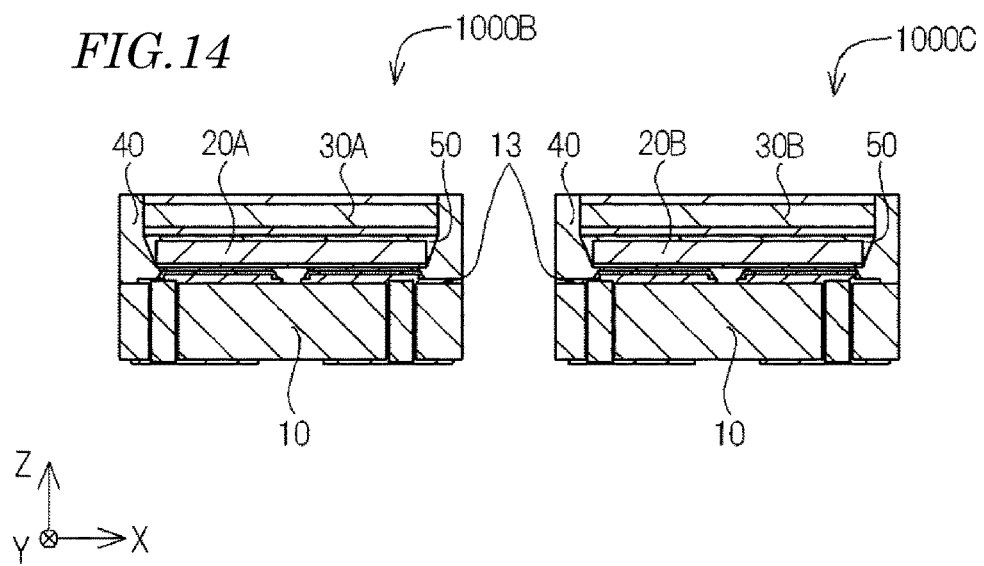
FIG. 14 is a schematic cross-sectional view illustrating the method of producing another modification of the light emitting devices according to the embodiment.
Figure 15:
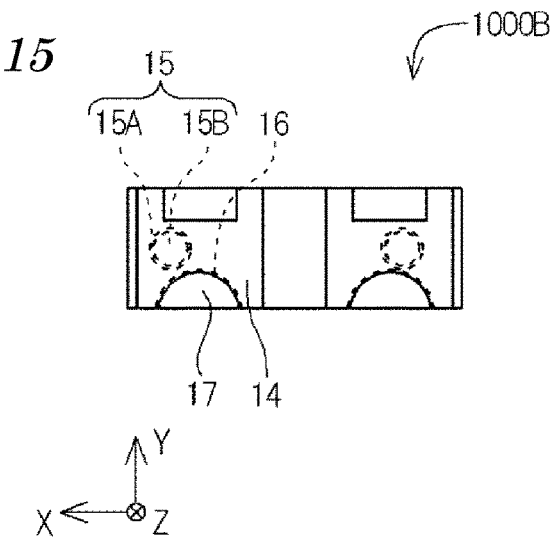
FIG. 15 is a schematic bottom view illustrating the method of producing said another modification of the light emitting devices according to the embodiment.

As shown in FIG. 14, at least a part of the connection wiring portion 13 positioned between the first light emitting element 20A and the second light emitting element 20B may be removed to provide a light emitting device 1000B including the first light emitting element 20A and a light emitting device 1000C including the second light emitting element 20B. As shown in FIG. 15, it is preferable that the substrate 10 of the light emitting device 1000B includes a plurality of recesses 16. With the structure in which the light emitting device 1000B includes the plurality of recesses 16, the joining strength between the light emitting device 1000B and the support substrate can be increased. Similarly, it is preferable that the substrate 10 of the light emitting device 1000C includes a plurality of recesses 16.

Figure 16A:
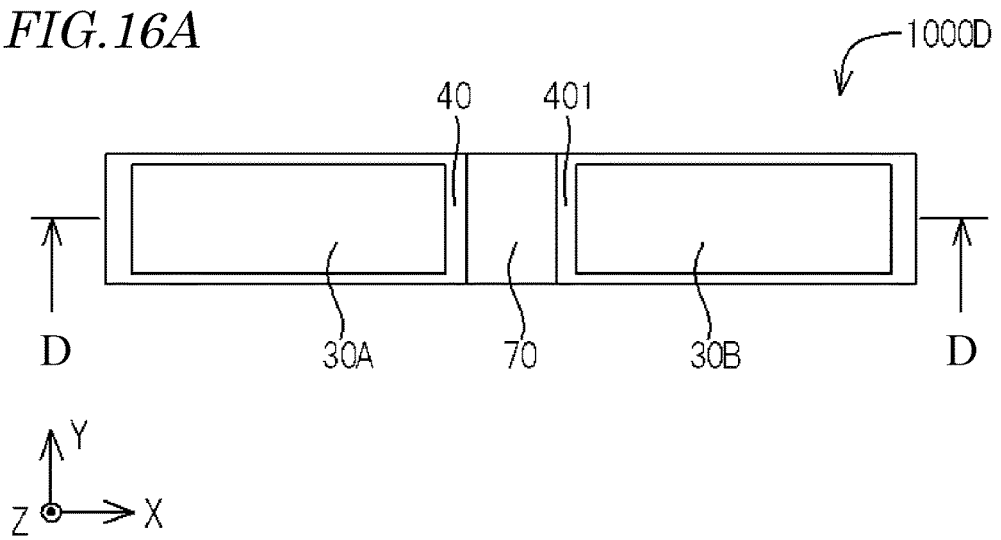
FIG. 16A is a schematic top view of still another modification of the light emitting device according to the embodiment.
Figure 16B:
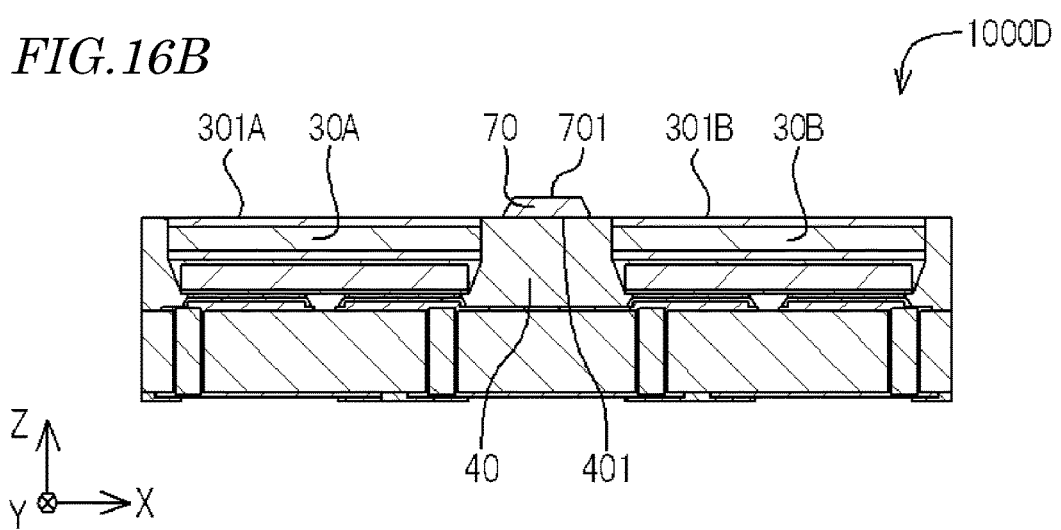
FIG. 16B is a schematic cross-sectional view taken along line D-D in FIG. 16A.

Referring to FIG. 16A and FIG. 16B, the light emitting device may further include a protective member provided on a top surface of the cover member 40. A light emitting device 1000D shown in FIG. 16A and FIG. 16B includes a protective member 70 provided on a top surface 401 of the cover member 40. As shown in FIG. 16B, at least a part of a top surface 701 of the protective member 70 is positioned higher than top surfaces 301A and 301B of the light-transmissive members 30A and 30B in the Z direction. Such a structure alleviate the top surfaces 301A and 301B of the light-transmissive members 30A and 30B to be damaged. It is preferable that the protective member 70 has a maximum thickness in the Z direction of 3 μm or greater and 50 μm or less. With the structure in which the maximum thickness of the protective member 70 is 3 μm or greater, the top surfaces 301A and 301B of the light-transmissive members 30A and 30B is less likely to be damaged. With the structure in which the maximum thickness of the protective member 70 is 50 μm or less, the light emitting device 1000D can have a decreased thickness in the Z direction.

Figure 16C:
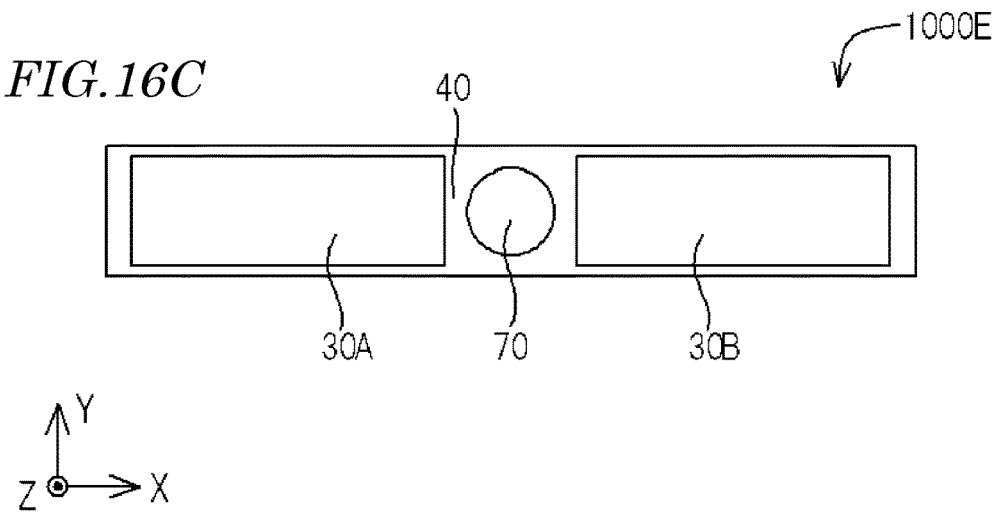
FIG. 16C is a schematic top view of yet another modification of the light emitting device according to the embodiment.

As shown in FIG. 16A, the protective member 70 may reach the outer edges of the cover member 40 as seen in a top view. However, the shape of the protective member 70 is not limited to this example. As in a light emitting device 1000E shown in FIG. 16C, the protective member 70 may be separate from outer edges of the cover member 40 as seen in a top view.

Figure 16D:
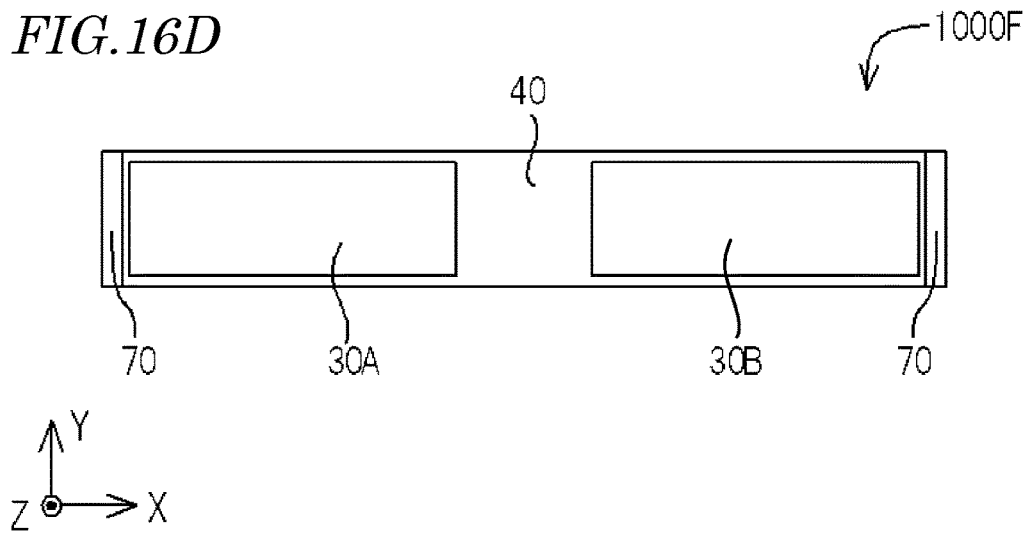
FIG. 16D is a schematic top view of yet another modification of the light emitting device according to the embodiment.
Figure 16E:
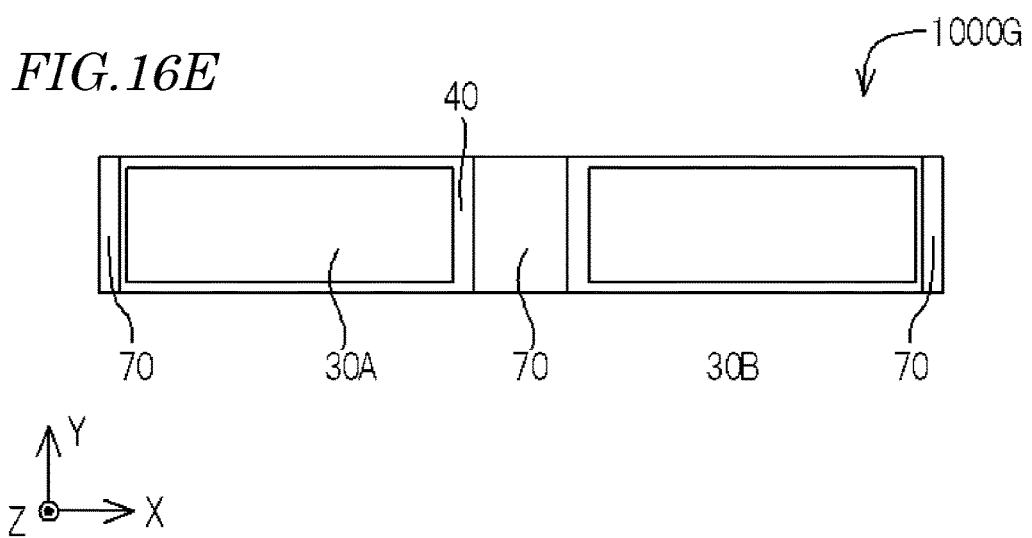
FIG. 16E is a schematic top view of yet another modification of the light emitting device according to the embodiment.

As in the light emitting device 1000D shown in FIG. 16A, the protective member 70 may be elongated in the shorter direction (i.e., Y direction) between the first light-transmissive member 30A and the second light-transmissive member 30B as seen in a top view. Alternatively, as in a light emitting device 1000F shown in FIG. 16D, the protective member 70 may be elongated in the shorter direction (i.e., Y direction) along each of outer edges of the cover member 40 in the longitudinal direction (i.e., X direction) as seen in a top view. As in a light emitting device 1000G shown in FIG. 16E, the light emitting device may include the protective member 70 elongated in the shorter direction (Y direction) between the first light-transmissive member 30A and the second light-transmissive member 30B and the protective member 70 elongated along each of the outer edges of the cover member 40 in the longitudinal direction (i.e., X direction) as seen in a top view.

Figure 16F:
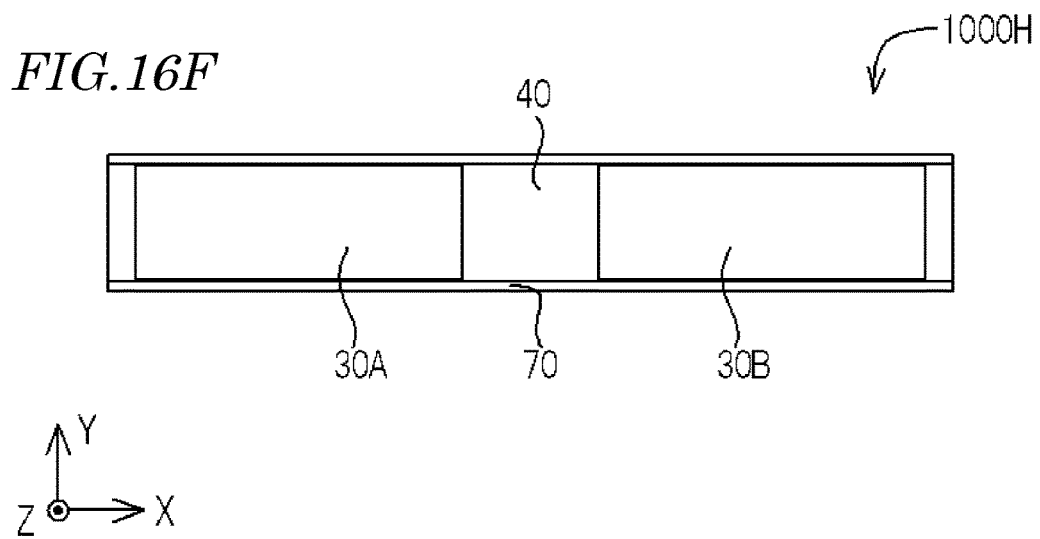
FIG. 16F is a schematic top view of yet another modification of the light emitting device according to the embodiment.
Figure 16G:
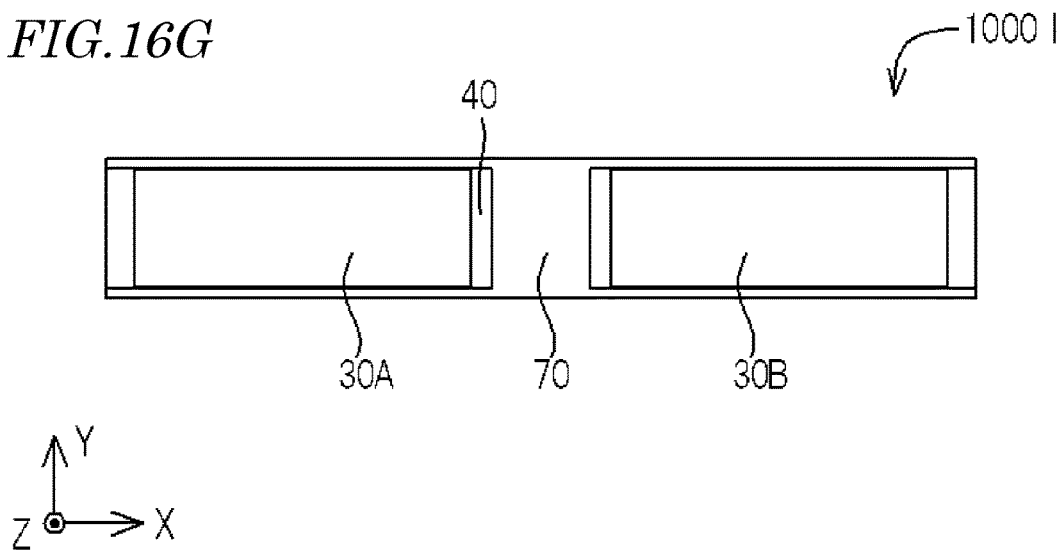
FIG. 16G is a schematic top view of yet another modification of the light emitting device according to the embodiment.
Figure 16H:
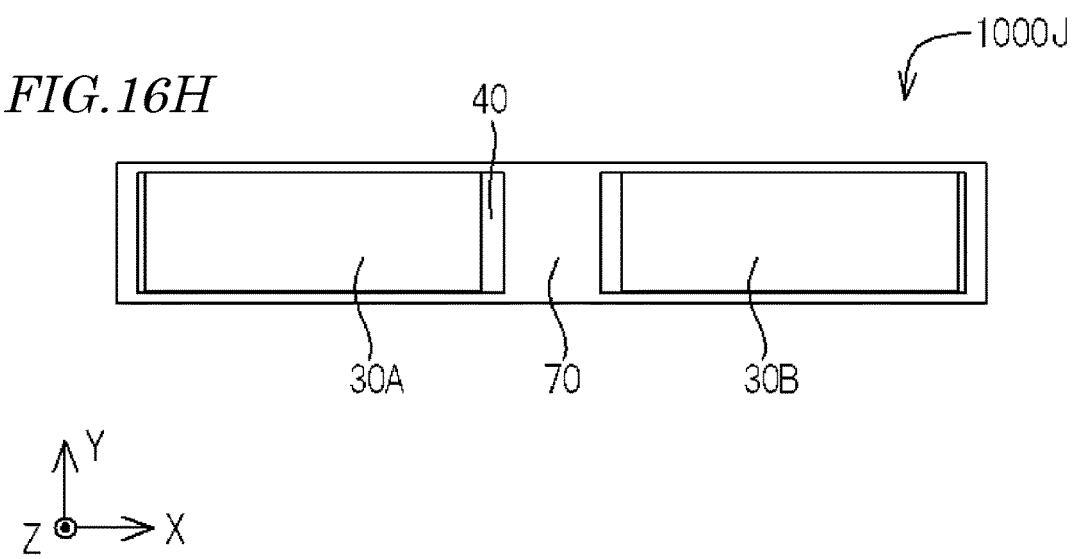
FIG. 16H is a schematic top view of yet another modification of the light emitting device according to the embodiment.

As in a light emitting device 1000H shown in FIG. 16F, the protective member 70 may be elongated in the longitudinal direction (i.e., X direction) along each of outer edges of the cover member 40 in the shorter direction (i.e., Y direction) as seen in a top view. As in a light emitting device 1000I shown in FIG. 16G, the protective member 70 may include a portion elongated in the longitudinal direction (i.e., X direction) along each of the outer edges of the cover member 40 in the shorter direction (i.e., Y direction) and a portion elongated in the shorter direction (i.e., Y direction) between the first light-transmissive member 30A and the second light-transmissive member 30B as seen in a top view. As in a light emitting device 1000J shown in FIG. 16H, the protective member 70 may include a portion elongated in the longitudinal direction (i.e., X direction) along each of the outer edges of the cover member 40 in the shorter direction (i.e., Y direction), a portion elongate in the shorter direction (i.e., Y direction) between the first light-transmissive member 30A and the second light-transmissive member 30B, and a portion elongated in the shorter direction (i.e., Y direction) along each of the outer edges of the cover member 40 in the longitudinal direction (i.e., X direction) as seen in a top view. In other words, the protective member 70 may continuously enclose each of the first light-transmissive member 30A and the second light-transmissive member 30B as seen in a top view.

Figure 16I:
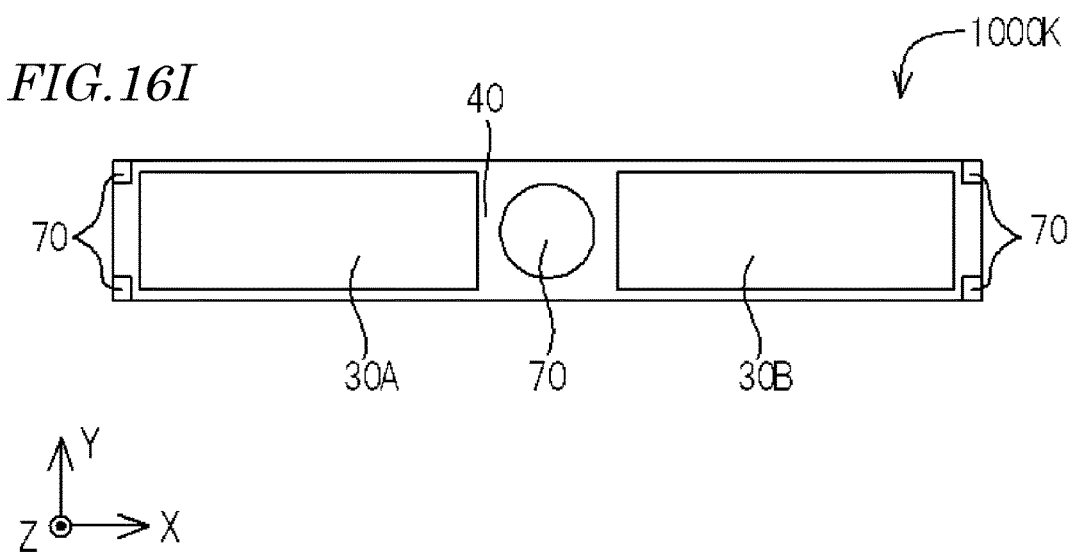
FIG. 16I is a schematic top view of yet another modification of the light emitting device according to the embodiment.

The protective member 70 may be positioned at least at one of four corners of the cover member 40, which is rectangular, as seen in a top view. As in a light emitting device 1000K shown in FIG. 16I, the protective member 70 may be positioned at each of all the four corners of the cover member 40, which is rectangular.

The protective member 70 may have a cross-section that is not required to have any particular shape and may be triangular, quadrangular or semicircular. As shown in FIG. 16B, the protective member 70 may have a trapezoidal cross-section. The top surface 701 of the protective member may include at least one protruding portion and/or recessed portion. As in a light emitting device 1000L shown in FIG. 16J, the top surface 701 of the protective member 70 may include protruding portions 702 at ends thereof or in the vicinity thereof.

Figure 16J:
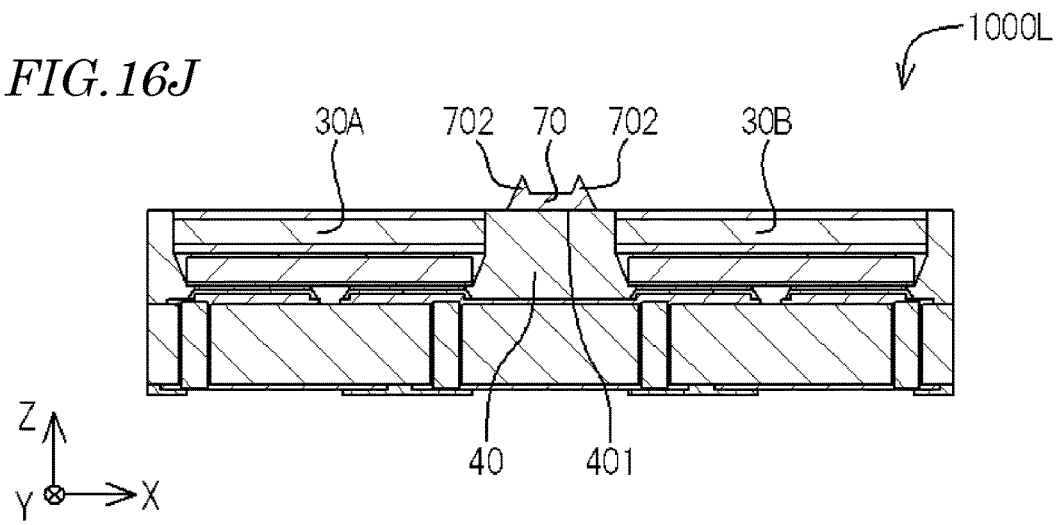
FIG. 16J is a schematic cross-sectional view of yet another modification of the light emitting device according to the embodiment.
Figure 16K:
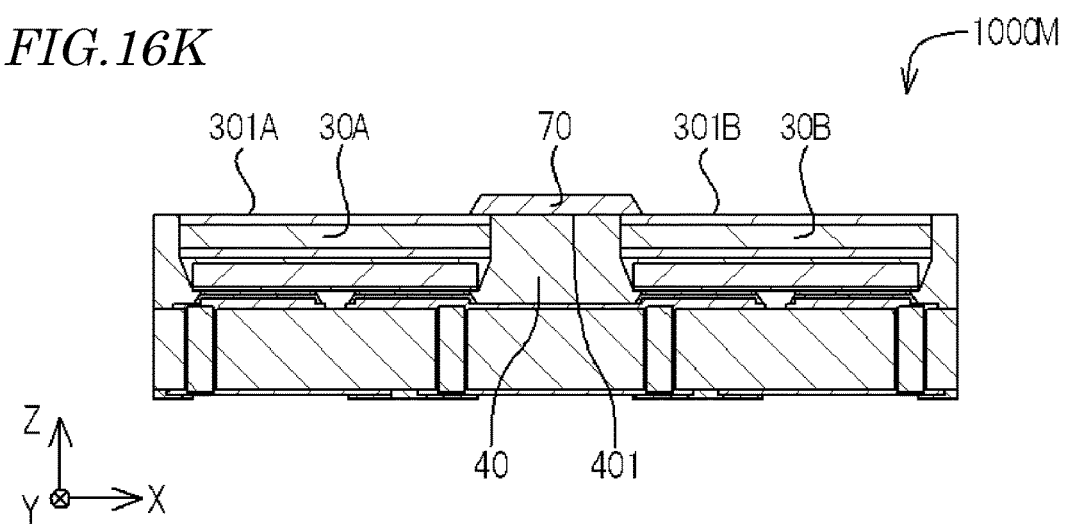
FIG. 16K is a schematic cross-sectional view of yet another modification of the light emitting device according to the embodiment.

As in a light emitting device 1000M shown in FIG. 16K, the protective member 70 may cover at least a part of each of the top surfaces 301A and 301B of the light-transmissive members 30A and 30B. As in the light emitting device 1000D shown in FIG. 16A, the protective member 70 may be separate from the light light-transmissive members 30A and 30B as seen in a top view. With the structure in which the protective member 70 is separate from the light light-transmissive members 30A and 30B as seen in a top view, light from the light-transmissive members 30A and 30B is less likely to be absorbed into the protective member 70. This can improve the light extraction efficiency of the light emitting device. In the case where the protective member 70 covers at least a part of the light-transmissive members 30A and 30B, it is preferable that the protective member 70 is light-transmissive. Such an arrangement can alleviate a decrease in the light extraction efficiency of the light emitting device.

The protective member 70 may be formed of the same or similar material as that of the light-transmissive members 30A and 30B. The protective member 70 may be formed by spraying a resin material or potting a resin material. In order to alleviate variance in the shape of the protective member 70, the top surface 401 of the cover member 40 may be partially masked before the resin material is sprayed to form the protective member 70. In the case where the top surface 401 of the cover member 40 is masked before the resin material is sprayed, the mask may be removed without the resin material being pre-cured or after the resin material is pre-cured. After the mask is removed, the resin material is completely cured to form the protective member 70.

Figure 16L:
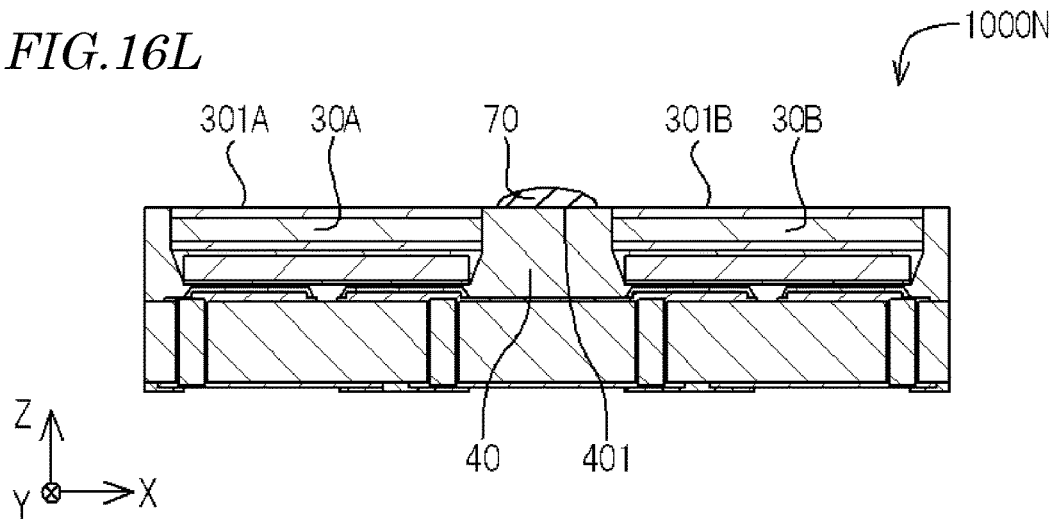
FIG. 16L is a schematic cross-sectional view of yet another modification of the light emitting device according to the embodiment.

In the case where the mask is removed without the resin material being pre-cured, as shown in, for example, FIG. 16B and FIG. 16L, a width of the protective member 70 in the X direction can be gradually increased as approaching in a −Z direction. The "−Z direction" refers to a direction from top to bottom in the Z direction. In other words, the "−Z direction" is a direction from the top surface 111 toward the bottom surface 112 of the base member 11. The resin material that is not pre-cured is easily deformable. Therefore, in the case where the mask is removed without the resin material being pre-cured, the resin material spreads on the top surface 401 of the cover member 40 after the mask is removed. This allows the width of the protective member 70 in the X direction to be gradually increased in the −Z direction.

On the other hand, in the case where the mask is removed after the resin material is pre-cured, as shown in, for example, FIG. 16J, the top surface 701 of the protective member 70 may include the protruding portion(s) 702 at the end(s) thereof or in the vicinity thereof. The resin material that is pre-cured is not easily deformable. Therefore, in the case where the mask is removed after the resin material is pre-cured, ends of the resin material are pulled by the mask while the mask is being removed. This may result in the formation of the protruding portions 702 at the ends of the protective member 70 or in the vicinity thereof. In this specification, the term "pre-curing" refers to putting the resin material into a semi-cured state that is called a "B stage".

Hereinafter, components of a light emitting device according to an embodiment of the present disclosure will be described.

Substrate 10

The substrate 10 is a member on which the light emitting element is placed. The substrate 10 may include at least the base member 11, the first wiring portion 12A, the second wiring portion 12B, the third wiring portion 12C, the fourth wiring portion 12D, and the connection wiring portion 13.

Base Member 11

The base member 11 may be formed of an insulating material such as a resin, a fiber-reinforced plastic resin (e.g., glass epoxy resin), or the like. For the resin or a fiber-reinforced resin, epoxy, glass epoxy, bismaleimide triazine (BT), polyimide, or the like can be used. Among these materials, it is preferable to use, especially, a material having a coefficient of linear thermal expansion close to that of the light emitting element. The lower limit of the thickness of the base member may be appropriately selected. From the point of view of the strength of the base member, the thickness of the base member is preferably 0.05 mm or greater, and is more preferably 0.2 mm or greater. From the point of view of the thickness (i.e., depth in the Z direction) of the light emitting device, the thickness of the base member is preferably 0.5 mm or less, and is more preferably 0.4 mm or less.

First Wiring Portion 12A, Second Wiring Portion 12B, Third Wiring Portion 12C, Fourth Wiring Portion 12D, Connection Wiring Portion 13

The first wiring portion, the second wiring portion, the third wiring portion, the fourth wiring portion and the connection wiring portion are disposed on the top surface of the base member, and are electrically connected with the light emitting element. The first wiring portion, the second wiring portion, the third wiring portion, the fourth wiring portion and the connection wiring portion may be made of material comprising copper, iron, nickel, tungsten, chromium, aluminum, silver, gold, titanium, palladium, rhodium, or an alloy thereof. The first wiring portion, the second wiring portion, the third wiring portion, the fourth wiring portion and the connection wiring portion each may be in a single layer or has a layered structure of the metal materials described above and alloys thereof. From the point of view of, especially, the heat dissipation, it is preferable to use copper or a copper alloy. The first wiring portion, the second wiring portion, the third wiring portion, the fourth wiring portion and the connection wiring portion may each include a surface layer of, for example, silver, platinum, aluminum, rhodium, gold or an alloy thereof from the point of view of, for example, wettability on the conductive bonding member and/or the light reflectance.

Fifth Wiring Portion 14

The fifth wiring portion is electrically connected with the first wiring portion, the second wiring portion, the third wiring portion, the fourth wiring portion and/or the connection wiring portion and is positioned on the bottom surface of the base member. The fifth wiring portion may be formed of a conductive material substantially the same as that of the first wiring portion, the second wiring portion, the third wiring portion, the fourth wiring portion and/or the connection wiring portion.

Light Emitting Element

The light emitting element is a semiconductor element configured to emit light when a voltage is applied. For the light emitting element, a known semiconductor element formed of a nitride semiconductor or the like can be used. The light emitting element may be, for example, an LED chip. The light emitting element includes at least a semiconductor layer, and in many cases, further includes an element substrate. The light emitting element includes electrodes. The electrodes may be made of gold, silver, tin, platinum, rhodium, titanium, aluminum, tungsten, palladium, nickel or an alloy thereof. A preferable material for the semiconductor layer may be a nitride semiconductor. The nitride semiconductor is generally expressed by general formula $In_xAl_yGa_{1-x-y}N$ ($0 \le x$, $0 \le y$, $x+y \le 1$). Other examples of materials usable for the semiconductor layer include an InAlGaAs-based semiconductor, an InAlGaP-based semiconductor, zinc sulfide, zinc selenide, silicon carbide and the like.

The element substrate of the light emitting element is generally a substrate for crystal growth, from which a semiconductor crystal forming the semiconductor layer may grow. Alternatively, the element substrate may be a bonding substrate, which is to be bonded to the semiconductor element structure that has been separated from the substrate for crystal growth. The element substrate may be light-transmissive, thereby enabling flip-chip mounting and exhibition of improved light extraction efficiency. The element substrate may be a substrate mainly containing sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The thickness of the element substrate may be appropriately selected, and is, for example, 0.02 mm or greater and 1 mm or less. From the point of view of the strength of the element substrate and/or the thickness of the light emitting device, it is preferable that the thickness of the element substrate is 0.05 mm or greater and 0.3 mm or less.

Cover Member 40

The cover member 40 covers the top surface of the base member and the lateral surface of the light emitting element, and protects the light emitting element. The cover member may contain a white pigment in a base material containing a resin material.

Light-Transmissive Member

The light-transmissive member covers the top surface of the light emitting element and protects the light emitting element. The light-transmissive member may be formed of, for example, a resin. Examples of the resin usable for the light-transmissive member include a silicone resin, an epoxy resin, a phenol resin, a polycarbonate resin, an acrylic resin, and a modified resin thereof. As the material of the light-transmissive member, an epoxy resin is preferable because use of an epoxy resin can increase the strength of the light emitting device than use of a silicone resin. A silicone resin and a modified resin thereof, which are highly resistant against heat and light, are also preferable as the material of the light-transmissive member. The light-transmissive member may contain wavelength conversion particles and/or diffusive particles.

Wavelength Conversion Particles

The wavelength conversion particles absorb at least a part of primary light emitted by the light emitting element and emit secondary light having a wavelength different from that of the primary light. The wavelength conversion particles may be formed of one material or a combination of two or more materials among the examples shown below. In the case where the light-transmissive member includes a plurality of wavelength conversion layers, the wavelength conversion layers may contain wavelength conversion particles of the same material as each other or wavelength conversion particles of different materials from each other.

Examples of materials of the wavelength conversion particles emitting green light include a yttrium-aluminum-garnet-based phosphor (e.g., $Y_3(Al, Ga)_5O_{12}$: Ce), a lutetium-aluminum-garnet-based phosphor (e.g., $Lu_3(Al, Ga)_5O_{12}$: Ce), a terbium-aluminum-garnet-based phosphor (e.g., $Tb_3(Al, Ga)_5O_{12}$: Ce), a silicate-based phosphor (e.g., $(Ba, Sr)_2SiO_4$: Eu), a chlorosilicate-based phosphor (e.g., $Ca_8Mg(SiO_4)_4Cl_2$: Eu), a β-SiAlON-based phosphor (e.g., $Si_{6-z}Al_zO_zN_{8-z}$: Eu (0<z<4.2)), an SGS-based phosphor (e.g., $SrGa_2S_4$: Eu), an alkaline earth alminate-based phosphor (e.g., $(Ba, Sr, Ca)Mg_xAl_{10}O_{16+x}$: Eu, Mn (0≤x1), and the like. Examples of materials of the wavelength conversion particles emitting yellow light include an α-SiAlON-based phosphor (e.g., $M_z(Si, Al)_{12}(O, N)_{16}$ (0<z≤2; M is Li, Mg, Ca, Y, or a lanthanide element excluding La and Ce), and the like. The above-described examples of materials of the wavelength conversion particles emitting green light include a material usable for the wavelength conversion particles emitting yellow light. For example, the yttrium-aluminum-garnet-based phosphor may have a part of Y replaced with Gd, so that the emission peak wavelength is shifted toward the longer side so as to emit yellow light. The above-described examples of materials of the wavelength conversion particles emitting yellow light include a material usable for wavelength conversion particles emitting orange light. Examples of materials of the wavelength conversion particles emitting red light include a nitrogen-containing calcium aluminosilicate (e.g., CASN or SCASN)-based phosphor (e.g., $(Sr, Ca)AlSiN_3$: Eu), a SLAN phosphor ($SrLiAl_3N_4$: Eu), and the like. Another example of material of the wavelength conversion particles emitting red light may be a manganese-activated fluoride-based phosphor (i.e., phosphor represented by general formula (I): $A_2[M_{1-a}M-n_aF_6]$ (in general formula (I), "A" is at least one selected from the group consisting of K, Li, Na, Rb, Cs and $NH_4$: "M" is at least one element selected from the group consisting of the group IV elements and the group XIV elements; and "a" satisfies 0<a<0.2)). A representative example of the manganese-activated fluoride-based phosphor is a phosphor of manganese-activated potassium fluorosilicate (e.g., $K_2SiF_6$: Mn).

Diffusive Particles

Examples of materials of the diffusive particles include silicon oxide, aluminum oxide, zirconium oxide, zinc oxide, and the like. The diffusive particles may be formed of a single material or a combination of two or more materials among these materials. It is especially preferable to use silicon oxide, which has a small coefficient of thermal expansion. As the diffusive particles, nanoparticles may be used. In this case, light emitted by the light emitting element is more scattered, which can reduce the amount of the wavelength conversion particles to be used. The "nanoparticle" refers to a particle having a particle size of 1 nm or longer and 100 nm or shorter. In this specification, the "particle size" is defined by, for example, $D_{50}$.

Light Guide Member 50

The light guide member secures the light emitting element and the light-transmissive member to each other, and guides the light from the light emitting element to the light-transmissive member. Examples of the base material of the light guide member are a silicone resin, an epoxy resin, a phenol resin, a polycarbonate resin, an acrylic resin and a modified resin thereof. As the material of the light guide member, an epoxy resin is preferable because use of an epoxy resin can increase the strength of the light emitting device than use of a silicone resin. A silicone resin and a modified resin thereof, which are highly resistant against heat and light, are also preferable as the material of the light guide member. The light guide member may contain wavelength conversion particles and/or diffusive particles substantially the same as or similar to those of the light-transmissive member described above.

Conductive Bonding Member 60

The conductive bonding member electrically connects the electrodes of the light emitting element and the first wiring portion to each other. The conductive bonding member may be any one of: bumps mainly containing gold, silver, copper or the like; metal pastes containing metal powder of silver, gold, copper, platinum, aluminum, palladium or the like and a resin binder; solder based on tin-bismuth, tin-copper, tin-silver, gold-tin or the like; and a brazing material of a low melting-point metal material; and the like.

A light emitting device according to an embodiment of the present disclosure can be used for, for example, backlight devices of liquid crystal display devices; various lighting devices; large-scale displays; various display devices for advertisements, destination guides and the like; projector devices; and image reading devices for digital video cameras, facsimiles, copiers, scanners and the like.

While certain embodiments of the present invention has been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A light emitting device, comprising:
a substrate comprising:
a base member containing a resin material and having a top surface;
a first wiring portion, a second wiring portion, a third wiring portion and a fourth wiring portion that are located on the top surface of the base member and are arrayed in a first direction; and
a connection wiring portion connecting the second wiring portion and the third wiring portion to each other;
a first light emitting element placed on the first wiring portion and the second wiring portion;
a second light emitting element placed on the third wiring portion and the fourth wiring portion; and a cover member covering the top surface of the base member, a lateral surface of the first light emitting element and a lateral surface of the second light emitting element, wherein the connection wiring portion includes a first connection end connected with the second wiring portion, a second connection end connected with the third wiring portion, and a connection central portion connecting the first connection end and the second connection end to each other, wherein the connection central portion has a maximum width in a second direction perpendicular to the first direction that is different from each of a maximum width of the first connection end and a maximum width of the second connection end, wherein in the second direction, at least a part of the connection wiring portion has a width that is narrower than each of a maximum width of the second wiring portion and a maximum width of the third wiring portion, wherein as seen in a top view, at least a part of the connection central portion is separate from the first light emitting element and the second light emitting element, and wherein in the second direction, the maximum width of the first connection end is at least 0.2 times and at most 0.6 times the maximum width of the second wiring portion.

2. The light emitting device of claim 1, wherein in the second direction, the maximum width of the connection central portion is wider than each of the maximum width of the first connection end and the maximum width of the second connection end.

3. The light emitting device of claim 2, wherein the connection central portion is elongated in the second direction.

4. The light emitting device of claim 1, wherein in the second direction, the maximum width of the connection central portion is narrower than each of the maximum width of the first connection end and the maximum width of the second connection end.

5. The light emitting device of claim 4, wherein in the second direction, a minimum distance from an outer edge of the base member to an outer edge of the connection wiring portion is longer than a minimum distance from the outer edge of the base member to an outer edge of the second wiring portion.

6. The light emitting device of claim 5, wherein in the second direction, the first light emitting element has a maximum width that is wider than a maximum width of the first wiring portion and the maximum width of the second wiring portion.

7. The light emitting device of claim 5, wherein as seen in the top view, an outer edge of the base member is separate from the first wiring portion, the second wiring portion, the third wiring portion, the fourth wiring portion and the connection wiring portion.

8. The light emitting device of claim 1, wherein in the second direction, the maximum width of the first connection end and the maximum width of the second connection end are equal to each other.

9. The light emitting device of claim 1, wherein in the second direction, a minimum distance from an outer edge of the base member to an outer edge of the connection wiring portion is longer than a minimum distance from the outer edge of the base member to an outer edge of the second wiring portion.

10. The light emitting device of claim 1, wherein in the second direction, the first light emitting element has a maximum width that is wider than a maximum width of the first wiring portion and the maximum width of the second wiring portion.

11. The light emitting device of claim 1, wherein as seen in the top view, an outer edge of the base member is separate from the first wiring portion, the second wiring portion, the third wiring portion, the fourth wiring portion and the connection wiring portion.

12. The light emitting device of claim 11, wherein the base member includes a bottom surface positioned opposite to the top surface, wherein the substrate includes a fifth wiring portion located on the bottom surface, and wherein the fifth wiring portion reaches outer edges of the base member facing each other.

13. The light emitting device of claim 1, further comprising a first light-transmissive member covering a top surface of at least one of the first light emitting element and the second light emitting element, and a protective member covering at least a part of a top surface of the cover member, wherein at least a part of a top surface of the protective member is positioned higher than a top surface of the first light-transmissive member.

14. A light emitting device, comprising:
a substrate comprising:
  a base member containing a resin material and having a top surface;
  a first wiring portion, a second wiring portion, a third wiring portion and a fourth wiring portion that are located on the top surface of the base member and are arrayed in a first direction; and
  a connection wiring portion connecting the second wiring portion and the third wiring portion to each other;
a first light emitting element placed on the first wiring portion and the second wiring portion;
a second light emitting element placed on the third wiring portion and the fourth wiring portion; and
a cover member covering the top surface of the base member, a lateral surface of the first light emitting element and a lateral surface of the second light emitting element, wherein the connection wiring portion includes a first connection end connected with the second wiring portion, a second connection end connected with the third wiring portion, and a connection central portion connecting the first connection end and the second connection end to each other, wherein the connection central portion has a maximum width in a second direction perpendicular to the first direction that is different from each of a maximum width of the first connection end and a maximum width of the second connection end, wherein in the second direction, at least a part of the connection wiring portion has a width that is narrower than each of a maximum width of the second wiring portion and a maximum width of the third wiring portion, wherein as seen in a top view, at least a part of the connection central portion is separate from the first light emitting element and the second light emitting element, wherein the light emitting device further comprising a first light-transmissive member covering a top surface of at least one of the first light emitting element and the second light emitting element, and a protective member covering at least a part of a top surface of the cover member, wherein at least a part of a top surface of the protective member is positioned higher than a top surface of the first light-transmissive member.

15. The light emitting device of claim 14, wherein in the second direction, the first light-transmissive member has a maximum width that is wider than the maximum width of the second wiring portion.

16. The light emitting device of claim 14, wherein the protective member is separate from the first light-transmissive member as seen in the top view.

17. The light emitting device of claim 14, further comprising a second light-transmissive member covering a top surface of the second light emitting element, wherein the protective member is positioned between the first light-transmissive member and the second light-transmissive member as seen in the top view.

18. The light emitting device of claim 14, wherein the cover member has a rectangular shape as seen in the top view, and wherein the protective member is positioned at least at one of four corners of the cover member.

19. The light emitting device of claim 1, wherein the base member includes a bottom surface positioned opposite to the top surface, wherein the substrate includes a fifth wiring portion located on the bottom surface, and wherein the fifth wiring portion reaches outer edges of the base member facing each other.

* * * * *